(12) United States Patent
Rosenband et al.

(10) Patent No.: US 8,977,806 B1
(45) Date of Patent: *Mar. 10, 2015

(54) HYBRID MEMORY MODULE

(75) Inventors: Daniel L. Rosenband, Cambridge, MA (US); Frederick Daniel Weber, San Jose, CA (US); Michael John Sebastian Smith, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/620,793

(22) Filed: Sep. 15, 2012

Related U.S. Application Data

(63) Continuation of application No. 12/057,306, filed on Mar. 27, 2008, now Pat. No. 8,397,013, which is a continuation-in-part of application No. 11/611,374, filed on Dec. 15, 2006, now Pat. No. 8,055,833.

(60) Provisional application No. 60/849,631, filed on Oct. 15, 2006.

(51) Int. Cl.
*G06F 12/00* (2006.01)
*G11C 7/00* (2006.01)

(52) U.S. Cl.
CPC ..................................... *G06F 12/00* (2013.01)
USPC ........... 711/103; 711/104; 711/105; 711/111; 711/148; 711/154; 365/205

(58) Field of Classification Search
USPC .......... 711/102, 103, 104, 105, 111, 148, 154
See application file for complete search history.

(56) References Cited

U.S. PATENT DOCUMENTS

| | | | |
|---|---|---|---|
| 3,800,292 A | 3/1974 | Curley et al. | |
| 4,069,452 A | 1/1978 | Conway et al. | |
| 4,323,965 A | 4/1982 | Johnson et al. | |
| 4,334,307 A | 6/1982 | Bourgeois et al. | |

(Continued)

FOREIGN PATENT DOCUMENTS

| | | | |
|---|---|---|---|
| DE | 102004051345 | 5/2006 | ............. G11C 29/12 |
| DE | 102004053316 | 5/2006 | |

(Continued)

OTHER PUBLICATIONS

Woo et al. ("An Optimized 3D,Stacked Memory Architecture by Exploiting Excessive, High,Density TSV Bandwidth, by Dong Hyuk Woo," 987-1-4244-5659-8/09/© 2009, IEEE, 2009 doi:10.1109/HPCA.2010.5416628).*

(Continued)

*Primary Examiner* — Mardochee Chery
(74) *Attorney, Agent, or Firm* — Fish & Richardson P.C.

(57) ABSTRACT

One embodiment of the present invention sets forth a hybrid memory module that combines memory devices of different types while presenting a single technology interface. The hybrid memory module includes a number of super-stacks and a first interface configured to transmit data between the super-stacks and a memory controller. Each super-stack includes a number of sub-stacks, a super-controller configured to control the sub-stacks, and a second interface configured to transmit data between the sub-stacks and the first interface. Combining memory devices of different types allows utilizing the favorable properties of each type of the memory devices, while hiding their unfavorable properties from the memory controller.

20 Claims, 11 Drawing Sheets

(56) References Cited

U.S. PATENT DOCUMENTS

| | | | |
|---|---|---|---|
| 4,345,319 A | 8/1982 | Bernardini et al. | |
| 4,392,212 A | 7/1983 | Miyasaka et al. | 365/230 |
| 4,500,958 A | 2/1985 | Manton et al. | |
| 4,525,921 A | 7/1985 | Carson et al. | |
| 4,566,082 A | 1/1986 | Anderson | |
| 4,592,019 A | 5/1986 | Huang et al. | 365/78 |
| 4,628,407 A | 12/1986 | August et al. | |
| 4,646,128 A | 2/1987 | Carson et al. | |
| 4,698,748 A | 10/1987 | Juzswik et al. | 364/200 |
| 4,706,166 A | 11/1987 | Go | |
| 4,710,903 A | 12/1987 | Hereth et al. | 365/194 |
| 4,764,846 A | 8/1988 | Go | |
| 4,780,843 A | 10/1988 | Tietjen | 364/900 |
| 4,794,597 A | 12/1988 | Ooba et al. | |
| 4,796,232 A | 1/1989 | House | 365/189 |
| 4,807,191 A | 2/1989 | Flannagan | |
| 4,841,440 A | 6/1989 | Yonezu et al. | 364/200 |
| 4,862,347 A | 8/1989 | Rudy | |
| 4,884,237 A | 11/1989 | Mueller et al. | |
| 4,887,240 A | 12/1989 | Garverick et al. | 361/222 |
| 4,888,687 A | 12/1989 | Allison et al. | |
| 4,899,107 A | 2/1990 | Corbett et al. | 324/158 |
| 4,912,678 A | 3/1990 | Mashiko | |
| 4,916,575 A | 4/1990 | Van Asten | |
| 4,922,451 A | 5/1990 | Lo et al. | |
| 4,935,734 A | 6/1990 | Austin | 340/825.83 |
| 4,937,791 A | 6/1990 | Steele et al. | |
| 4,956,694 A | 9/1990 | Eide | |
| 4,982,265 A | 1/1991 | Watanabe et al. | |
| 4,983,533 A | 1/1991 | Go | |
| 5,025,364 A | 6/1991 | Zellmer | |
| 5,072,424 A | 12/1991 | Brent et al. | 365/189 |
| 5,083,266 A | 1/1992 | Watanabe | 395/275 |
| 5,104,820 A | 4/1992 | Go et al. | |
| 5,193,072 A | 3/1993 | Frenkil et al. | |
| 5,212,666 A | 5/1993 | Takeda | |
| 5,220,672 A | 6/1993 | Nakao et al. | 395/750 |
| 5,222,014 A | 6/1993 | Lin | |
| 5,241,266 A | 8/1993 | Ahmad et al. | 324/158 |
| 5,252,807 A | 10/1993 | Chizinsky | 219/390 |
| 5,257,233 A | 10/1993 | Schaefer | 365/227 |
| 5,278,796 A | 1/1994 | Tillinghast et al. | 365/211 |
| 5,282,177 A | 1/1994 | McLaury | 365/230 |
| 5,332,922 A | 7/1994 | Oguchi et al. | 257/723 |
| 5,347,428 A | 9/1994 | Carson et al. | |
| 5,369,749 A | 11/1994 | Baker et al. | |
| 5,384,745 A | 1/1995 | Konishi et al. | 365/230.03 |
| 5,388,265 A | 2/1995 | Volk | 395/750 |
| 5,390,078 A | 2/1995 | Taylor | |
| 5,390,334 A | 2/1995 | Harrison | |
| 5,392,251 A | 2/1995 | Manning | |
| 5,408,190 A | 4/1995 | Wood et al. | 324/765 |
| 5,432,729 A | 7/1995 | Carson et al. | |
| 5,448,511 A | 9/1995 | Paurus et al. | |
| 5,453,434 A | 9/1995 | Albaugh et al. | 514/397 |
| 5,467,455 A | 11/1995 | Gay et al. | 395/281 |
| 5,483,497 A | 1/1996 | Mochizuki et al. | |
| 5,498,886 A | 3/1996 | Hsu et al. | 757/713 |
| 5,502,333 A | 3/1996 | Bertin et al. | |
| 5,502,667 A | 3/1996 | Bertin et al. | |
| 5,513,135 A | 4/1996 | Dell et al. | |
| 5,513,339 A | 4/1996 | Agrawal et al. | |
| 5,519,832 A | 5/1996 | Warchol | |
| 5,526,320 A | 6/1996 | Zagar et al. | 365/233 |
| 5,530,836 A | 6/1996 | Busch et al. | 395/477 |
| 5,550,781 A | 8/1996 | Sugawara et al. | |
| 5,559,990 A | 9/1996 | Cheng et al. | 395/484 |
| 5,561,622 A | 10/1996 | Bertin et al. | |
| 5,563,086 A | 10/1996 | Bertin et al. | |
| 5,566,344 A | 10/1996 | Hall et al. | 395/800 |
| 5,581,498 A | 12/1996 | Ludwig et al. | |
| 5,581,779 A | 12/1996 | Hall et al. | 395/800 |
| 5,590,071 A | 12/1996 | Kolor et al. | 365/149 |
| 5,598,376 A | 1/1997 | Merritt et al. | 365/230 |
| 5,604,714 A | 2/1997 | Manning et al. | 365/230 |
| 5,606,710 A | 2/1997 | Hall et al. | 395/800 |
| 5,608,262 A | 3/1997 | Degani et al. | |
| 5,610,864 A | 3/1997 | Manning | 365/193 |
| 5,623,686 A | 4/1997 | Hall et al. | 395/800 |
| 5,627,791 A | 5/1997 | Wright et al. | 365/222 |
| 5,640,337 A | 6/1997 | Huang et al. | 364/578 |
| 5,640,364 A | 6/1997 | Merritt et al. | 365/233 |
| 5,652,724 A | 7/1997 | Manning | 365/189 |
| 5,654,204 A | 8/1997 | Anderson | 438/15 |
| 5,661,677 A | 8/1997 | Rondeau et al. | 365/63 |
| 5,661,695 A | 8/1997 | Zagar et al. | 365/233 |
| 5,668,773 A | 9/1997 | Zagar et al. | 365/233 |
| 5,675,549 A | 10/1997 | Ong et al. | 365/233 |
| 5,680,342 A | 10/1997 | Frankeny | |
| 5,682,354 A | 10/1997 | Manning | 365/233 |
| 5,692,121 A | 11/1997 | Bozso et al. | |
| 5,692,202 A | 11/1997 | Kardach et al. | 395/750 |
| 5,696,732 A | 12/1997 | Zagar et al. | 365/233 |
| 5,696,929 A | 12/1997 | Hasbun et al. | |
| 5,702,984 A | 12/1997 | Bertin et al. | |
| 5,703,813 A | 12/1997 | Manning et al. | 365/189 |
| 5,706,247 A | 1/1998 | Merritt et al. | 365/233 |
| RE35,733 E | 2/1998 | Hernandez et al. | |
| 5,717,654 A | 2/1998 | Manning | 365/233 |
| 5,721,859 A | 2/1998 | Manning | 397/421 |
| 5,724,288 A | 3/1998 | Cloud et al. | 365/193 |
| 5,729,503 A | 3/1998 | Manning | 365/233 |
| 5,729,504 A | 3/1998 | Cowles | 365/236 |
| 5,742,792 A | 4/1998 | Yanai et al. | |
| 5,748,914 A | 5/1998 | Barth et al. | 395/285 |
| 5,752,045 A | 5/1998 | Chen | 395/750 |
| 5,757,703 A | 5/1998 | Merritt et al. | 365/189 |
| 5,760,478 A | 6/1998 | Bozso et al. | |
| 5,761,703 A | 6/1998 | Bolyn | 711/106 |
| 5,765,203 A | 6/1998 | Sangha | |
| 5,781,766 A | 7/1998 | Davis | 395/557 |
| 5,787,457 A | 7/1998 | Miller et al. | |
| 5,798,961 A | 8/1998 | Heyden et al. | 365/52 |
| 5,802,010 A | 9/1998 | Zagar et al. | 365/233 |
| 5,802,395 A | 9/1998 | Connolly et al. | |
| 5,802,555 A | 9/1998 | Shigeeda | 711/106 |
| 5,812,488 A | 9/1998 | Zagar et al. | 365/233 |
| 5,818,788 A | 10/1998 | Kimura et al. | |
| 5,819,065 A | 10/1998 | Chilton et al. | |
| 5,831,833 A | 11/1998 | Shirakawa et al. | |
| 5,831,931 A | 11/1998 | Manning | 365/233 |
| 5,831,932 A | 11/1998 | Merritt et al. | 365/233 |
| 5,834,838 A | 11/1998 | Anderson | 257/697 |
| 5,835,435 A | 11/1998 | Bogin et al. | 365/22 |
| 5,838,165 A | 11/1998 | Chatter | |
| 5,838,177 A | 11/1998 | Keeth | 327/108 |
| 5,841,580 A | 11/1998 | Farmwald et al. | 365/194 |
| 5,843,799 A | 12/1998 | Hsu et al. | 438/6 |
| 5,843,807 A | 12/1998 | Burns | |
| 5,845,108 A | 12/1998 | Yoo et al. | 395/551 |
| 5,850,368 A | 12/1998 | Ong et al. | 365/238 |
| 5,859,792 A | 1/1999 | Rondeau et al. | 365/52 |
| 5,860,106 A | 1/1999 | Domen et al. | 711/137 |
| 5,870,347 A | 2/1999 | Keeth et al. | 365/230 |
| 5,870,350 A | 2/1999 | Bertin et al. | |
| 5,872,907 A | 2/1999 | Griess et al. | |
| 5,875,142 A | 2/1999 | Chevallier | 365/212 |
| 5,878,279 A | 3/1999 | Athenes | |
| 5,884,088 A | 3/1999 | Kardach et al. | 395/750.06 |
| 5,901,105 A | 5/1999 | Ong et al. | 365/230.06 |
| 5,903,500 A | 5/1999 | Tsang et al. | 365/189.05 |
| 5,905,688 A | 5/1999 | Park | 365/227 |
| 5,907,512 A | 5/1999 | Parkinson et al. | 365/195 |
| 5,910,010 A | 6/1999 | Nishizawa et al. | |
| 5,913,072 A | 6/1999 | Wieringa | |
| 5,915,105 A | 6/1999 | Farmwald et al. | 395/309 |
| 5,915,167 A | 6/1999 | Leedy | |
| 5,917,758 A | 6/1999 | Keeth | 365/189.05 |
| 5,923,611 A | 7/1999 | Ryan | 365/233 |
| 5,924,111 A | 7/1999 | Huang et al. | |
| 5,926,435 A | 7/1999 | Park et al. | |
| 5,929,650 A | 7/1999 | Pappert et al. | 324/763 |
| 5,943,254 A | 8/1999 | Bakeman, Jr. et al. | |
| 5,946,265 A | 8/1999 | Cowles | 365/233 |

(56) References Cited

U.S. PATENT DOCUMENTS

| | | | |
|---|---|---|---|
| 5,949,254 A | 9/1999 | Keeth | 326/87 |
| 5,953,215 A | 9/1999 | Karabatsos | |
| 5,953,263 A | 9/1999 | Farmwald et al. | 365/194 |
| 5,954,804 A | 9/1999 | Farmwald et al. | 710/36 |
| 5,956,233 A | 9/1999 | Yew et al. | |
| 5,960,468 A | 9/1999 | Paluch | |
| 5,962,435 A | 10/1999 | Mao et al. | 514/63 |
| 5,963,429 A | 10/1999 | Chen | |
| 5,963,463 A | 10/1999 | Rondeau et al. | 365/52 |
| 5,963,464 A | 10/1999 | Dell et al. | |
| 5,963,504 A | 10/1999 | Manning | 365/233 |
| 5,966,724 A | 10/1999 | Ryan | 711/105 |
| 5,966,727 A | 10/1999 | Nishino | 711/127 |
| 5,969,996 A | 10/1999 | Muranaka et al. | 365/189.01 |
| 5,973,392 A | 10/1999 | Senba et al. | |
| 5,978,304 A | 11/1999 | Crafts | |
| 5,995,424 A | 11/1999 | Lawrence et al. | |
| 5,995,443 A | 11/1999 | Farmwald et al. | 365/233 |
| 6,001,671 A | 12/1999 | Fjelstad | |
| 6,002,613 A | 12/1999 | Cloud et al. | 365/189 |
| 6,002,627 A | 12/1999 | Chevallier | 365/212 |
| 6,014,339 A | 1/2000 | Kobayashi et al. | 365/233 |
| 6,016,282 A | 1/2000 | Keeth | 365/233 |
| 6,026,027 A | 2/2000 | Terrell, II et al. | |
| 6,026,050 A | 2/2000 | Baker et al. | 365/233 |
| 6,029,250 A | 2/2000 | Keeth | 713/400 |
| 6,032,214 A | 2/2000 | Farmwald et al. | 710/129 |
| 6,032,215 A | 2/2000 | Farmwald et al. | 710/129 |
| 6,034,916 A | 3/2000 | Lee | 365/233 |
| 6,034,918 A | 3/2000 | Farmwald et al. | 365/233 |
| 6,035,365 A | 3/2000 | Farmwald et al. | 710/129 |
| 6,038,195 A | 3/2000 | Farmwald et al. | 365/233 |
| 6,038,673 A | 3/2000 | Benn et al. | 713/323 |
| 6,044,028 A | 3/2000 | Kumagai et al. | |
| 6,044,032 A | 3/2000 | Li | 365/230 |
| 6,047,073 A | 4/2000 | Norris et al. | |
| 6,047,344 A | 4/2000 | Kawasumi et al. | 710/107 |
| 6,047,361 A | 4/2000 | Ingenio et al. | |
| 6,053,948 A | 4/2000 | Vaidyanathan et al. | 713/14 |
| 6,058,451 A | 5/2000 | Bermingham et al. | |
| 6,065,092 A | 5/2000 | Roy | |
| 6,069,504 A | 5/2000 | Keeth | 327/108 |
| 6,070,217 A | 5/2000 | Connolly et al. | |
| 6,073,223 A | 6/2000 | McAllister et al. | 711/167 |
| 6,075,730 A | 6/2000 | Barth et al. | 365/191 |
| 6,075,744 A | 6/2000 | Tsern et al. | 365/230 |
| 6,078,546 A | 6/2000 | Lee | 365/233 |
| 6,079,025 A | 6/2000 | Fung | 713/323 |
| 6,084,434 A | 7/2000 | Keeth | 326/87 |
| 6,088,290 A | 7/2000 | Ohtake et al. | 365/233 |
| 6,091,251 A | 7/2000 | Wood et al. | 324/755 |
| RE36,839 E | 8/2000 | Simmons et al. | 326/93 |
| 6,101,152 A | 8/2000 | Farmwald et al. | 365/233 |
| 6,101,564 A | 8/2000 | Athenes et al. | |
| 6,101,612 A | 8/2000 | Jeddeloh | 713/401 |
| 6,108,795 A | 8/2000 | Jeddeloh | 713/401 |
| 6,111,812 A | 8/2000 | Gans et al. | 365/233 |
| 6,125,072 A | 9/2000 | Wu | |
| 6,134,638 A | 10/2000 | Olarig et al. | 711/167 |
| 6,154,370 A | 11/2000 | Degani et al. | |
| 6,166,991 A | 12/2000 | Phelan | 365/233 |
| 6,181,640 B1 | 1/2001 | Kang | |
| 6,182,184 B1 | 1/2001 | Farmwald et al. | 710/129 |
| 6,199,151 B1 | 3/2001 | Williams et al. | |
| 6,208,168 B1 | 3/2001 | Rhee | 326/83 |
| 6,216,246 B1 | 4/2001 | Shau | 714/763 |
| 6,222,739 B1 | 4/2001 | Bhakta et al. | |
| 6,226,709 B1 | 5/2001 | Goodwin et al. | |
| 6,226,730 B1 | 5/2001 | Murdoch et al. | |
| 6,233,192 B1 | 5/2001 | Tanaka | |
| 6,233,650 B1 | 5/2001 | Johnson et al. | |
| 6,240,048 B1 | 5/2001 | Matsubara | 365/233 |
| 6,243,282 B1 | 6/2001 | Rondeau et al. | 365/52 |
| 6,252,807 B1 | 6/2001 | Suzuki et al. | |
| 6,253,278 B1 | 6/2001 | Ryan | |
| 6,260,097 B1 | 7/2001 | Farmwald et al. | 710/129 |
| 6,260,154 B1 | 7/2001 | Jeddeloh | 713/401 |
| 6,262,938 B1 | 7/2001 | Lee et al. | 365/233 |
| 6,266,285 B1 | 7/2001 | Farmwald et al. | 365/194 |
| 6,266,292 B1 | 7/2001 | Tsern et al. | 365/230 |
| 6,274,395 B1 | 8/2001 | Weber | 438/14 |
| 6,279,069 B1 | 8/2001 | Robinson et al. | 711/103 |
| 6,295,572 B1 | 9/2001 | Wu | 710/131 |
| 6,297,966 B1 | 10/2001 | Lee et al. | |
| 6,298,426 B1 | 10/2001 | Ajanovic | 711/172 |
| 6,304,511 B1 | 10/2001 | Gans et al. | 365/233 |
| 6,307,769 B1 | 10/2001 | Nuxoll et al. | 365/63 |
| 6,314,051 B1 | 11/2001 | Farmwald et al. | 365/233 |
| 6,317,352 B1 | 11/2001 | Halbert et al. | 365/52 |
| 6,317,381 B1 | 11/2001 | Gans et al. | 365/233 |
| 6,324,120 B2 | 11/2001 | Farmwald et al. | 365/233 |
| 6,326,810 B1 | 12/2001 | Keeth | 326/83 |
| 6,327,664 B1 | 12/2001 | Dell et al. | 713/323 |
| 6,330,683 B1 | 12/2001 | Jeddeloh | 713/401 |
| 6,336,174 B1 | 1/2002 | Li et al. | |
| 6,338,108 B1 | 1/2002 | Motomura | 710/110 |
| 6,338,113 B1 | 1/2002 | Kubo et al. | 711/105 |
| 6,341,347 B1 | 1/2002 | Joy et al. | 712/228 |
| 6,343,019 B1 | 1/2002 | Jiang et al. | |
| 6,343,042 B1 | 1/2002 | Tsern et al. | 365/222 |
| 6,353,561 B1 | 3/2002 | Funyu et al. | 365/195 |
| 6,356,105 B1 | 3/2002 | Volk | 326/30 |
| 6,356,500 B1 | 3/2002 | Cloud et al. | 365/226 |
| 6,362,656 B2 | 3/2002 | Rhee | 326/87 |
| 6,363,031 B2 | 3/2002 | Phelan | 365/233 |
| 6,378,020 B2 | 4/2002 | Farmwald et al. | 710/129 |
| 6,381,188 B1 | 4/2002 | Choi et al. | 365/222 |
| 6,381,668 B1 | 4/2002 | Lunteren | 711/5 |
| 6,389,514 B1 | 5/2002 | Rokicki | |
| 6,392,304 B1 | 5/2002 | Butler | |
| 6,414,868 B1 | 7/2002 | Wong et al. | 365/51 |
| 6,418,034 B1 | 7/2002 | Weber et al. | |
| 6,421,754 B1 | 7/2002 | Kau et al. | |
| 6,424,532 B2 | 7/2002 | Kawamura | |
| 6,426,916 B2 | 7/2002 | Farmwald et al. | 365/233 |
| 6,429,029 B1 | 8/2002 | Eldridge et al. | 438/14 |
| 6,430,103 B2 | 8/2002 | Nakayama et al. | 365/230.03 |
| 6,434,660 B1 | 8/2002 | Lambert et al. | |
| 6,437,600 B1 | 8/2002 | Keeth | 326/86 |
| 6,438,057 B1 | 8/2002 | Ruckerbauer | 365/222 |
| 6,442,698 B2 | 8/2002 | Nizar | 13/320 |
| 6,445,591 B1 | 9/2002 | Kwong | |
| 6,452,826 B1 | 9/2002 | Kim et al. | |
| 6,452,863 B2 | 9/2002 | Farmwald et al. | 365/233 |
| 6,453,400 B1 | 9/2002 | Maesako et al. | 711/167 |
| 6,453,402 B1 | 9/2002 | Jeddeloh | 711/167 |
| 6,453,434 B2 | 9/2002 | Delp et al. | |
| 6,455,348 B1 | 9/2002 | Yamaguchi | |
| 6,457,095 B1 | 9/2002 | Volk | 711/105 |
| 6,459,651 B1 | 10/2002 | Lee et al. | 365/233 |
| 6,470,417 B1 | 10/2002 | Kolor et al. | |
| 6,473,831 B1 | 10/2002 | Schade | 711/115 |
| 6,476,476 B1 | 11/2002 | Glenn | |
| 6,480,929 B1 | 11/2002 | Gauthier et al. | 711/105 |
| 6,487,102 B1 | 11/2002 | Halbert et al. | |
| 6,489,669 B2 | 12/2002 | Shimada et al. | |
| 6,490,161 B1 | 12/2002 | Johnson | |
| 6,492,726 B1 | 12/2002 | Quek et al. | |
| 6,493,789 B2 | 12/2002 | Ware et al. | 711/105 |
| 6,496,440 B2 | 12/2002 | Manning | 365/230.03 |
| 6,496,897 B2 | 12/2002 | Ware et al. | 711/105 |
| 6,498,766 B2 | 12/2002 | Lee et al. | 365/233 |
| 6,510,097 B2 | 1/2003 | Fukuyama | 365/230.03 |
| 6,510,503 B2 | 1/2003 | Gillingham et al. | 711/167 |
| 6,512,392 B2 | 1/2003 | Fleury et al. | 324/765 |
| 6,521,984 B2 | 2/2003 | Matsuura | |
| 6,526,471 B2 | 2/2003 | Shimomura et al. | 711/5 |
| 6,526,473 B1 | 2/2003 | Kim | |
| 6,526,484 B1 | 2/2003 | Stacovsky et al. | 711/158 |
| 6,545,895 B1 | 4/2003 | Li et al. | |
| 6,546,446 B2 | 4/2003 | Farmwald et al. | 710/305 |
| 6,553,450 B1 | 4/2003 | Dodd et al. | 711/105 |
| 6,560,158 B2 | 5/2003 | Choi et al. | 365/226 |
| 6,563,337 B2 | 5/2003 | Dour | 326/30 |

(56) References Cited

U.S. PATENT DOCUMENTS

| | | | | |
|---|---|---|---|---|
| 6,563,759 | B2 | 5/2003 | Yahata et al. | 365/233 |
| 6,564,281 | B2 | 5/2003 | Farmwald et al. | 710/305 |
| 6,564,285 | B1 | 5/2003 | Mills et al. | 711/103 |
| 6,574,150 | B2 | 6/2003 | Suyama et al. | 365/189.05 |
| 6,584,036 | B2 | 6/2003 | Kurjanowicz et al. | |
| 6,584,037 | B2 | 6/2003 | Farmwald et al. | 365/233 |
| 6,587,912 | B2 | 7/2003 | Leddige et al. | 711/5 |
| 6,590,822 | B2 | 7/2003 | Hwang et al. | 365/222 |
| 6,594,770 | B1 | 7/2003 | Sato et al. | 713/320 |
| 6,597,616 | B2 | 7/2003 | Tsern et al. | 365/222 |
| 6,597,617 | B2 | 7/2003 | Ooishi et al. | |
| 6,614,700 | B2 | 9/2003 | Dietrich et al. | 365/194 |
| 6,618,267 | B1 | 9/2003 | Dalal et al. | |
| 6,618,791 | B1 | 9/2003 | Dodd et al. | 711/105 |
| 6,621,760 | B1 | 9/2003 | Ahmad et al. | 365/233 |
| 6,628,538 | B2 | 9/2003 | Funaba et al. | |
| 6,629,282 | B1 | 9/2003 | Sugamori et al. | |
| 6,630,729 | B2 | 10/2003 | Huang | |
| 6,631,086 | B1 | 10/2003 | Bill et al. | 365/185.09 |
| 6,639,820 | B1 | 10/2003 | Khandekar et al. | |
| 6,646,939 | B2 | 11/2003 | Kwak | |
| 6,650,588 | B2 | 11/2003 | Yamagata | 365/222 |
| 6,650,594 | B1 | 11/2003 | Lee et al. | 365/233 |
| 6,657,634 | B1 | 12/2003 | Sinclair et al. | |
| 6,657,918 | B2 | 12/2003 | Foss et al. | 365/233 |
| 6,657,919 | B2 | 12/2003 | Foss et al. | 365/233 |
| 6,658,016 | B1 | 12/2003 | Dai et al. | |
| 6,658,530 | B1 | 12/2003 | Robertson et al. | 711/115 |
| 6,659,512 | B1 | 12/2003 | Harper et al. | |
| 6,664,625 | B2 | 12/2003 | Hiruma | |
| 6,665,224 | B1 | 12/2003 | Lehmann et al. | 365/222 |
| 6,665,227 | B2 | 12/2003 | Fetzer | 365/229 |
| 6,668,242 | B1 | 12/2003 | Reynov et al. | |
| 6,674,154 | B2 | 1/2004 | Minamio et al. | |
| 6,683,372 | B1 | 1/2004 | Wong et al. | |
| 6,684,292 | B1 | 1/2004 | Piccirillo et al. | |
| 6,690,191 | B2 | 2/2004 | Wu et al. | |
| 6,697,295 | B2 | 2/2004 | Farmwald et al. | 365/233 |
| 6,701,446 | B2 | 3/2004 | Tsern et al. | 713/501 |
| 6,705,877 | B1 | 3/2004 | Li et al. | |
| 6,708,144 | B1 | 3/2004 | Merryman et al. | 703/14 |
| 6,710,430 | B2 | 3/2004 | Minamio et al. | |
| 6,711,043 | B2 | 3/2004 | Friedman et al. | |
| 6,713,856 | B2 | 3/2004 | Tsai et al. | |
| 6,714,433 | B2 | 3/2004 | Doblar et al. | |
| 6,714,891 | B2 | 3/2004 | Dendinger | 702/132 |
| 6,724,684 | B2 | 4/2004 | Kim | 365/233 |
| 6,730,540 | B2 | 5/2004 | Siniaguine | |
| 6,731,009 | B1 | 5/2004 | Jones et al. | |
| 6,731,527 | B2 | 5/2004 | Brown | 365/63 |
| 6,742,098 | B1 | 5/2004 | Halbert et al. | |
| 6,744,687 | B2 | 6/2004 | Koo et al. | 365/226 |
| 6,747,887 | B2 | 6/2004 | Halbert et al. | |
| 6,751,113 | B2 | 6/2004 | Bhakta et al. | |
| 6,751,696 | B2 | 6/2004 | Farmwald et al. | 710/305 |
| 6,754,129 | B2 | 6/2004 | Khatri et al. | 365/226 |
| 6,754,132 | B2 | 6/2004 | Kyung | 365/233 |
| 6,757,751 | B1 | 6/2004 | Gene | |
| 6,762,948 | B2 | 7/2004 | Kyun et al. | 365/51 |
| 6,765,812 | B2 | 7/2004 | Anderson | |
| 6,766,469 | B2 | 7/2004 | Larson et al. | |
| 6,771,526 | B2 | 8/2004 | LaBerge | |
| 6,772,359 | B2 | 8/2004 | Kwak et al. | |
| 6,779,097 | B2 | 8/2004 | Gillingham et al. | 711/167 |
| 6,785,767 | B2 | 8/2004 | Coulson | 711/112 |
| 6,791,877 | B2 | 9/2004 | Miura et al. | 365/185 |
| 6,795,899 | B2 | 9/2004 | Dodd et al. | 711/137 |
| 6,799,241 | B2 | 9/2004 | Kahn et al. | 711/105 |
| 6,801,989 | B2 | 10/2004 | Johnson et al. | 711/167 |
| 6,807,598 | B2 | 10/2004 | Farmwald et al. | 710/305 |
| 6,807,650 | B2 | 10/2004 | Lamb et al. | |
| 6,807,655 | B1 | 10/2004 | Rehani et al. | 516/4 |
| 6,810,475 | B1 | 10/2004 | Tardieux | |
| 6,816,991 | B2 | 11/2004 | Sanghani | 714/733 |
| 6,819,602 | B2 | 11/2004 | Seo et al. | 365/193 |
| 6,819,617 | B2 | 11/2004 | Hwang et al. | 365/222 |
| 6,820,163 | B1 | 11/2004 | McCall et al. | 710/310 |
| 6,820,169 | B2 | 11/2004 | Wilcox et al. | 711/105 |
| 6,826,104 | B2 | 11/2004 | Kawaguchi et al. | 365/222 |
| 6,839,290 | B2 | 1/2005 | Ahmad et al. | 365/193 |
| 6,844,754 | B2 | 1/2005 | Yamagata | |
| 6,845,027 | B2 | 1/2005 | Mayer et al. | |
| 6,845,055 | B1 | 1/2005 | Koga et al. | 365/229 |
| 6,847,582 | B2 | 1/2005 | Pan | 365/233 |
| 6,850,449 | B2 | 2/2005 | Takahashi | 365/222 |
| 6,854,043 | B2 | 2/2005 | Hargis et al. | |
| 6,862,202 | B2 | 3/2005 | Schaefer | |
| 6,862,249 | B2 | 3/2005 | Kyung | 365/233 |
| 6,862,653 | B1 | 3/2005 | Dodd et al. | 711/105 |
| 6,873,534 | B2 | 3/2005 | Bhakta et al. | |
| 6,878,570 | B2 | 4/2005 | Lyu et al. | |
| 6,894,933 | B2 | 5/2005 | Kuzmenka et al. | 365/189.05 |
| 6,898,683 | B2 | 5/2005 | Nakamura | 711/167 |
| 6,908,314 | B2 | 6/2005 | Brown | 439/68 |
| 6,912,778 | B2 | 7/2005 | Ahn et al. | 29/852 |
| 6,914,786 | B1 | 7/2005 | Paulsen et al. | |
| 6,917,219 | B2 | 7/2005 | New | 326/41 |
| 6,922,371 | B2 | 7/2005 | Takahashi et al. | 365/227 |
| 6,930,900 | B2 | 8/2005 | Bhakta et al. | |
| 6,930,903 | B2 | 8/2005 | Bhakta et al. | |
| 6,938,119 | B2 | 8/2005 | Kohn et al. | 11/105 |
| 6,943,450 | B2 | 9/2005 | Fee et al. | |
| 6,944,748 | B2 | 9/2005 | Sanches et al. | |
| 6,947,341 | B2 | 9/2005 | Stubbs et al. | |
| 6,951,982 | B2 | 10/2005 | Chye et al. | |
| 6,952,794 | B2 | 10/2005 | Lu | |
| 6,961,281 | B2 | 11/2005 | Wong et al. | 365/230.03 |
| 6,968,416 | B2 | 11/2005 | Moy | 10/310 |
| 6,968,419 | B1 | 11/2005 | Holman | 711/5 |
| 6,970,968 | B1 | 11/2005 | Holman | 711/5 |
| 6,980,021 | B1 | 12/2005 | Srivastava et al. | 326/30 |
| 6,986,118 | B2 | 1/2006 | Dickman | 716/8 |
| 6,992,501 | B2 | 1/2006 | Rapport | |
| 6,992,950 | B2 | 1/2006 | Foss et al. | 365/233 |
| 7,000,062 | B2 | 2/2006 | Perego et al. | 711/5 |
| 7,003,618 | B2 | 2/2006 | Perego et al. | 1/5 |
| 7,003,639 | B2 | 2/2006 | Tsern et al. | 711/154 |
| 7,007,095 | B2 | 2/2006 | Chen et al. | |
| 7,007,175 | B2 | 2/2006 | Chang et al. | 713/300 |
| 7,010,642 | B2 | 3/2006 | Perego et al. | 711/5 |
| 7,010,736 | B1 | 3/2006 | Teh et al. | 714/733 |
| 7,024,518 | B2 | 4/2006 | Halbert et al. | 711/115 |
| 7,026,708 | B2 | 4/2006 | Cady et al. | |
| 7,028,215 | B2 | 4/2006 | Depew et al. | |
| 7,028,234 | B2 | 4/2006 | Huckaby et al. | 714/710 |
| 7,033,861 | B1 | 4/2006 | Partridge et al. | |
| 7,035,150 | B2 | 4/2006 | Streif et al. | 365/194 |
| 7,043,599 | B1 | 5/2006 | Ware et al. | 711/106 |
| 7,043,611 | B2 | 5/2006 | McClannahan et al. | |
| 7,045,396 | B2 | 5/2006 | Crowley et al. | |
| 7,045,901 | B2 | 5/2006 | Lin et al. | |
| 7,046,538 | B2 | 5/2006 | Kinsley et al. | |
| 7,053,470 | B1 | 5/2006 | Sellers et al. | |
| 7,053,478 | B2 | 5/2006 | Roper et al. | |
| 7,058,776 | B2 | 6/2006 | Lee | 711/167 |
| 7,058,863 | B2 | 6/2006 | Kouchi et al. | 714/718 |
| 7,061,784 | B2 | 6/2006 | Jakobs et al. | |
| 7,061,823 | B2 | 6/2006 | Faue et al. | 365/230.08 |
| 7,062,689 | B2 | 6/2006 | Slobodnik | |
| 7,066,741 | B2 | 6/2006 | Burns et al. | |
| 7,075,175 | B2 | 7/2006 | Kazi et al. | 257/678 |
| 7,079,396 | B2 | 7/2006 | Gates et al. | |
| 7,079,441 | B1 | 7/2006 | Partsch et al. | 365/226 |
| 7,079,446 | B2 | 7/2006 | Murtagh et al. | 365/233 |
| 7,085,152 | B2 | 8/2006 | Ellis et al. | 365/149 |
| 7,085,941 | B2 | 8/2006 | Li | 713/300 |
| 7,089,438 | B2 | 8/2006 | Raad | 713/322 |
| 7,093,101 | B2 | 8/2006 | Aasheim et al. | 711/207 |
| 7,103,730 | B2 | 9/2006 | Saxena et al. | 711/156 |
| 7,110,322 | B2 | 9/2006 | Farmwald et al. | |
| 7,111,143 | B2 | 9/2006 | Walker | |
| 7,117,309 | B2 | 10/2006 | Bearden | |
| 7,119,428 | B2 | 10/2006 | Tanie et al. | |
| 7,120,727 | B2 | 10/2006 | Lee et al. | 711/5 |

(56) References Cited

U.S. PATENT DOCUMENTS

| | | | |
|---|---|---|---|
| 7,126,399 B1 | 10/2006 | Lee | 327/261 |
| 7,127,567 B2 | 10/2006 | Ramakrishnan et al. | |
| 7,133,960 B1 | 11/2006 | Thompson et al. | 711/5 |
| 7,136,978 B2 | 11/2006 | Miura et al. | 711/165 |
| 7,138,823 B2 | 11/2006 | Janzen et al. | |
| 7,149,145 B2 | 12/2006 | Kim et al. | 365/233 |
| 7,149,824 B2 | 12/2006 | Johnson | 710/35 |
| 7,173,863 B2 | 2/2007 | Conley et al. | 365/189 |
| 7,177,206 B2 | 2/2007 | Lee | |
| 7,200,021 B2 | 4/2007 | Raghuram | 365/51 |
| 7,205,789 B1 | 4/2007 | Karabatsos | 326/30 |
| 7,210,059 B2 | 4/2007 | Jeddeloh | |
| 7,215,561 B2 | 5/2007 | Park et al. | |
| 7,218,566 B1 | 5/2007 | Totolos, Jr. et al. | |
| 7,224,595 B2 | 5/2007 | Dreps et al. | 365/63 |
| 7,228,264 B2 | 6/2007 | Barrenscheen et al. | 703/23 |
| 7,231,562 B2 | 6/2007 | Ohlhoff et al. | |
| 7,233,541 B2 | 6/2007 | Yamamoto et al. | 365/230.03 |
| 7,234,081 B2 | 6/2007 | Nguyen et al. | |
| 7,243,185 B2 | 7/2007 | See et al. | |
| 7,245,541 B2 | 7/2007 | Janzen | 365/198 |
| 7,254,036 B2 | 8/2007 | Pauley et al. | 361/721 |
| 7,266,639 B2 | 9/2007 | Raghuram | 711/115 |
| 7,269,042 B2 | 9/2007 | Kinsley et al. | 365/52 |
| 7,269,708 B2 | 9/2007 | Ware | 711/203 |
| 7,274,583 B2 | 9/2007 | Park et al. | |
| 7,277,333 B2 | 10/2007 | Schaefer | |
| 7,286,436 B2 | 10/2007 | Bhakta et al. | 365/230 |
| 7,289,386 B2 | 10/2007 | Bhakta et al. | 365/230 |
| 7,296,754 B2 | 11/2007 | Nishizawa et al. | 235/492 |
| 7,299,330 B2 | 11/2007 | Gillingham et al. | 711/167 |
| 7,302,598 B2 | 11/2007 | Suzuki et al. | |
| 7,307,863 B2 | 12/2007 | Yen et al. | 365/63 |
| 7,317,250 B2 | 1/2008 | Koh et al. | |
| 7,336,490 B2 | 2/2008 | Harris et al. | |
| 7,337,293 B2 | 2/2008 | Brittain et al. | |
| 7,363,422 B2 | 4/2008 | Perego et al. | 711/105 |
| 7,366,947 B2 | 4/2008 | Gower et al. | |
| 7,379,316 B2 | 5/2008 | Rajan | 365/63 |
| 7,386,656 B2 | 6/2008 | Rajan et al. | 711/103 |
| 7,392,338 B2 | 6/2008 | Rajan et al. | 711/103 |
| 7,408,393 B1 | 8/2008 | Jain et al. | 327/202 |
| 7,409,492 B2 | 8/2008 | Tanaka et al. | 711/103 |
| 7,414,917 B2 | 8/2008 | Ruckerbauer et al. | |
| 7,428,644 B2 | 9/2008 | Jeddeloh et al. | |
| 7,437,579 B2 | 10/2008 | Jeddeloh et al. | 713/300 |
| 7,441,064 B2 | 10/2008 | Gaskins | |
| 7,457,122 B2 | 11/2008 | Lai et al. | |
| 7,464,225 B2 | 12/2008 | Tsern | 711/115 |
| 7,472,220 B2 | 12/2008 | Rajan et al. | 711/103 |
| 7,474,576 B2 | 1/2009 | Co et al. | |
| 7,480,147 B2 | 1/2009 | Hoss et al. | |
| 7,480,774 B2 | 1/2009 | Ellis et al. | |
| 7,496,777 B2 | 2/2009 | Kapil | 713/324 |
| 7,499,281 B2 | 3/2009 | Harris et al. | |
| 7,515,453 B2 | 4/2009 | Rajan | 365/63 |
| 7,532,537 B2 | 5/2009 | Solomon et al. | 365/230 |
| 7,539,800 B2 | 5/2009 | Dell et al. | |
| 7,573,136 B2 | 8/2009 | Jiang et al. | |
| 7,580,312 B2 | 8/2009 | Rajan et al. | |
| 7,581,121 B2 | 8/2009 | Barth et al. | |
| 7,581,127 B2 | 8/2009 | Rajan et al. | |
| 7,590,796 B2 | 9/2009 | Rajan et al. | |
| 7,599,205 B2 | 10/2009 | Rajan | |
| 7,606,245 B2 | 10/2009 | Ma et al. | |
| 7,609,567 B2 | 10/2009 | Rajan et al. | |
| 7,613,880 B2 | 11/2009 | Miura et al. | |
| 7,619,912 B2 | 11/2009 | Bhakta et al. | |
| 7,724,589 B2 | 5/2010 | Rajan et al. | |
| 7,730,338 B2 | 6/2010 | Rajan et al. | |
| 7,738,252 B2 | 6/2010 | Schuette et al. | |
| 7,761,724 B2 | 7/2010 | Rajan et al. | |
| 7,791,889 B2 | 9/2010 | Belady et al. | |
| 7,911,798 B2 | 3/2011 | Chang et al. | |
| 7,934,070 B2 | 4/2011 | Brittain et al. | |
| 7,990,797 B2 | 8/2011 | Moshayedi et al. | |
| 8,019,589 B2 | 9/2011 | Rajan et al. | |
| 8,041,881 B2 | 10/2011 | Rajan et al. | |
| 8,340,953 B2 | 12/2012 | Rajan et al. | |
| 2001/0000822 A1 | 5/2001 | Dell et al. | 711/170 |
| 2001/0003198 A1 | 6/2001 | Wu | |
| 2001/0011322 A1 | 8/2001 | Stolt et al. | |
| 2001/0019509 A1* | 9/2001 | Aho et al. | 365/205 |
| 2001/0021106 A1 | 9/2001 | Weber et al. | |
| 2001/0021137 A1 | 9/2001 | Kai et al. | |
| 2001/0046129 A1 | 11/2001 | Broglia et al. | |
| 2001/0046163 A1 | 11/2001 | Yanagawa | |
| 2001/0052062 A1 | 12/2001 | Lipovski | |
| 2002/0002662 A1 | 1/2002 | Olarig et al. | |
| 2002/0004897 A1 | 1/2002 | Kao et al. | |
| 2002/0015340 A1 | 2/2002 | Batinovich | |
| 2002/0019961 A1 | 2/2002 | Blodgett | 714/718 |
| 2002/0034068 A1 | 3/2002 | Weber et al. | |
| 2002/0038405 A1 | 3/2002 | Leddige et al. | 711/115 |
| 2002/0040416 A1 | 4/2002 | Tsern et al. | |
| 2002/0041507 A1 | 4/2002 | Woo et al. | 365/51 |
| 2002/0051398 A1 | 5/2002 | Mizugaki | 365/222 |
| 2002/0060945 A1 | 5/2002 | Ikeda | |
| 2002/0060948 A1 | 5/2002 | Chang et al. | |
| 2002/0064073 A1 | 5/2002 | Chien | 365/200 |
| 2002/0064083 A1 | 5/2002 | Ryu et al. | 365/233 |
| 2002/0089831 A1 | 7/2002 | Forthun | |
| 2002/0089970 A1 | 7/2002 | Asada et al. | |
| 2002/0094671 A1 | 7/2002 | Distefano et al. | |
| 2002/0121650 A1 | 9/2002 | Minamio et al. | |
| 2002/0121670 A1 | 9/2002 | Minamio et al. | |
| 2002/0124195 A1 | 9/2002 | Nizar | 713/320 |
| 2002/0129204 A1 | 9/2002 | Leighnor et al. | |
| 2002/0145900 A1 | 10/2002 | Schaefer | 365/52 |
| 2002/0165706 A1 | 11/2002 | Raynham | 703/25 |
| 2002/0167092 A1 | 11/2002 | Fee et al. | |
| 2002/0172024 A1 | 11/2002 | Hui et al. | |
| 2002/0174274 A1 | 11/2002 | Wu et al. | 710/100 |
| 2002/0184438 A1 | 12/2002 | Usui | 711/106 |
| 2003/0002262 A1 | 1/2003 | Benisek et al. | 361/728 |
| 2003/0011993 A1 | 1/2003 | Summers et al. | |
| 2003/0016550 A1 | 1/2003 | Yoo et al. | |
| 2003/0021175 A1 | 1/2003 | Tae Kwak | 365/219 |
| 2003/0026155 A1 | 2/2003 | Yamagata | |
| 2003/0026159 A1 | 2/2003 | Frankowsky et al. | |
| 2003/0035312 A1 | 2/2003 | Halbert et al. | |
| 2003/0039158 A1 | 2/2003 | Horiguchi et al. | |
| 2003/0041295 A1 | 2/2003 | Hou et al. | |
| 2003/0061458 A1 | 3/2003 | Wilcox et al. | 711/167 |
| 2003/0061459 A1 | 3/2003 | Aboulenein et al. | |
| 2003/0083855 A1 | 5/2003 | Fukuyama | |
| 2003/0088743 A1 | 5/2003 | Rader | |
| 2003/0093614 A1 | 5/2003 | Kohn et al. | 711/105 |
| 2003/0101392 A1 | 5/2003 | Lee | 714/718 |
| 2003/0105932 A1 | 6/2003 | David et al. | 711/167 |
| 2003/0110339 A1 | 6/2003 | Calvignac et al. | |
| 2003/0117875 A1 | 6/2003 | Lee et al. | 365/226 |
| 2003/0123389 A1 | 7/2003 | Russell et al. | |
| 2003/0126338 A1 | 7/2003 | Dodd et al. | 710/305 |
| 2003/0127737 A1 | 7/2003 | Takahashi | |
| 2003/0131160 A1 | 7/2003 | Hampel et al. | 710/22 |
| 2003/0145163 A1 | 7/2003 | Seo et al. | 711/106 |
| 2003/0158995 A1 | 8/2003 | Lee et al. | 711/105 |
| 2003/0164539 A1 | 9/2003 | Yau | |
| 2003/0164543 A1 | 9/2003 | Kheng Lee | |
| 2003/0174569 A1 | 9/2003 | Amidi | |
| 2003/0182513 A1 | 9/2003 | Dodd et al. | 711/137 |
| 2003/0183934 A1 | 10/2003 | Barrett | |
| 2003/0189868 A1 | 10/2003 | Riesenman et al. | 365/226 |
| 2003/0189870 A1 | 10/2003 | Wilcox | 365/233 |
| 2003/0191888 A1 | 10/2003 | Klein | 711/105 |
| 2003/0191915 A1 | 10/2003 | Saxena et al. | 711/160 |
| 2003/0200382 A1 | 10/2003 | Wells et al. | 711/106 |
| 2003/0200474 A1 | 10/2003 | Li | 713/320 |
| 2003/0205802 A1 | 11/2003 | Segaram et al. | |
| 2003/0206476 A1 | 11/2003 | Joo | |
| 2003/0217303 A1 | 11/2003 | Chua-Eoan et al. | |
| 2003/0223290 A1 | 12/2003 | Park et al. | 365/200 |
| 2003/0227798 A1 | 12/2003 | Pax | 365/189.12 |

(56) References Cited

U.S. PATENT DOCUMENTS

| | | | |
|---|---|---|---|
| 2003/0229821 A1 | 12/2003 | Ma | 714/8 |
| 2003/0230801 A1 | 12/2003 | Jiang et al. | |
| 2003/0231540 A1 | 12/2003 | Lazar et al. | |
| 2003/0231542 A1 | 12/2003 | Zaharinova-Papazova et al. | 365/226 |
| 2003/0234664 A1 | 12/2003 | Yamagata | |
| 2004/0000708 A1 | 1/2004 | Rapport et al. | |
| 2004/0016994 A1 | 1/2004 | Huang | |
| 2004/0027902 A1 | 2/2004 | Ooishi et al. | |
| 2004/0034732 A1 | 2/2004 | Valin et al. | 711/4 |
| 2004/0034755 A1 | 2/2004 | LaBerge et al. | |
| 2004/0037133 A1 | 2/2004 | Park et al. | 365/202 |
| 2004/0042503 A1 | 3/2004 | Shaeffer et al. | |
| 2004/0044808 A1 | 3/2004 | Salmon et al. | 710/8 |
| 2004/0047228 A1 | 3/2004 | Chen | 365/232 |
| 2004/0049624 A1 | 3/2004 | Salmonsen | |
| 2004/0057317 A1 | 3/2004 | Schaefer | |
| 2004/0064647 A1 | 4/2004 | DeWhitt et al. | 711/135 |
| 2004/0064767 A1 | 4/2004 | Huckaby et al. | 714/710 |
| 2004/0083324 A1 | 4/2004 | Rabinovitz et al. | |
| 2004/0088475 A1 | 5/2004 | Streif et al. | 711/105 |
| 2004/0100837 A1 | 5/2004 | Lee | |
| 2004/0117723 A1 | 6/2004 | Foss | 714/805 |
| 2004/0123173 A1 | 6/2004 | Emberling et al. | 714/733 |
| 2004/0125635 A1 | 7/2004 | Kuzmenka | |
| 2004/0133374 A1 | 7/2004 | Kattan | |
| 2004/0133736 A1 | 7/2004 | Kyung | 711/105 |
| 2004/0139359 A1 | 7/2004 | Samson et al. | 713/320 |
| 2004/0145963 A1 | 7/2004 | Byon | 365/233 |
| 2004/0151038 A1 | 8/2004 | Ruckerbauer et al. | |
| 2004/0174765 A1 | 9/2004 | Seo et al. | 365/233 |
| 2004/0177079 A1 | 9/2004 | Gluhovsky et al. | 707/100 |
| 2004/0178824 A1 | 9/2004 | Pan | |
| 2004/0184324 A1 | 9/2004 | Pax | 365/189.12 |
| 2004/0186956 A1 | 9/2004 | Perego et al. | 711/115 |
| 2004/0188704 A1 | 9/2004 | Halbert et al. | 257/145 |
| 2004/0195682 A1 | 10/2004 | Kimura | |
| 2004/0196732 A1 | 10/2004 | Lee | 365/233 |
| 2004/0205433 A1 | 10/2004 | Gower et al. | |
| 2004/0208173 A1 | 10/2004 | Di Gregorio | 370/360 |
| 2004/0225858 A1 | 11/2004 | Brueggen | |
| 2004/0228166 A1 | 11/2004 | Braun et al. | 365/154 |
| 2004/0228196 A1 | 11/2004 | Kwak et al. | |
| 2004/0228203 A1 | 11/2004 | Koo | 365/233 |
| 2004/0230932 A1 | 11/2004 | Dickmann | 716/10 |
| 2004/0236877 A1 | 11/2004 | Burton | |
| 2004/0250989 A1 | 12/2004 | Im et al. | |
| 2004/0256638 A1 | 12/2004 | Perego et al. | 257/200 |
| 2004/0257847 A1 | 12/2004 | Matsui et al. | |
| 2004/0257857 A1 | 12/2004 | Yamamoto et al. | |
| 2004/0260957 A1 | 12/2004 | Jeddeloh et al. | 713/300 |
| 2004/0264255 A1 | 12/2004 | Royer | 365/189.01 |
| 2004/0268161 A1 | 12/2004 | Ross | 713/300 |
| 2005/0018495 A1 | 1/2005 | Bhakta et al. | 365/19 |
| 2005/0021874 A1 | 1/2005 | Georgiou et al. | 709/250 |
| 2005/0024963 A1 | 2/2005 | Jakobs et al. | |
| 2005/0027928 A1 | 2/2005 | Avraham et al. | 711/103 |
| 2005/0028038 A1 | 2/2005 | Pomaranski et al. | 714/42 |
| 2005/0034004 A1 | 2/2005 | Bunker et al. | |
| 2005/0036350 A1 | 2/2005 | So et al. | |
| 2005/0041504 A1 | 2/2005 | Perego et al. | |
| 2005/0044302 A1 | 2/2005 | Pauley et al. | |
| 2005/0044303 A1 | 2/2005 | Perego et al. | 711/5 |
| 2005/0044305 A1 | 2/2005 | Jakobs et al. | 711/105 |
| 2005/0047192 A1 | 3/2005 | Matsui et al. | 365/145 |
| 2005/0071543 A1 | 3/2005 | Ellis et al. | 711/106 |
| 2005/0078532 A1 | 4/2005 | Ruckerbauer et al. | 365/199 |
| 2005/0081085 A1 | 4/2005 | Ellis et al. | 714/5 |
| 2005/0086548 A1 | 4/2005 | Haid et al. | |
| 2005/0099834 A1 | 5/2005 | Funaba et al. | |
| 2005/0102590 A1 | 5/2005 | Norris et al. | 714/719 |
| 2005/0105318 A1 | 5/2005 | Funaba et al. | |
| 2005/0108460 A1 | 5/2005 | David | |
| 2005/0127531 A1 | 6/2005 | Tay et al. | |
| 2005/0132158 A1 | 6/2005 | Hampel et al. | 711/167 |
| 2005/0135176 A1 | 6/2005 | Ramakrishnan et al. | |
| 2005/0138267 A1 | 6/2005 | Bains et al. | 711/100 |
| 2005/0138304 A1 | 6/2005 | Ramakrishnan et al. | |
| 2005/0139977 A1 | 6/2005 | Nishio et al. | 257/686 |
| 2005/0141199 A1 | 6/2005 | Chiou et al. | 361/704 |
| 2005/0149662 A1 | 7/2005 | Perego et al. | 711/5 |
| 2005/0152212 A1 | 7/2005 | Yang et al. | 365/233 |
| 2005/0156934 A1 | 7/2005 | Perego et al. | |
| 2005/0166026 A1 | 7/2005 | Ware et al. | 711/167 |
| 2005/0193163 A1 | 9/2005 | Perego et al. | 711/105 |
| 2005/0193183 A1 | 9/2005 | Barth et al. | |
| 2005/0194676 A1 | 9/2005 | Fukuda et al. | |
| 2005/0194991 A1 | 9/2005 | Dour et al. | 326/30 |
| 2005/0195629 A1 | 9/2005 | Leddige et al. | 365/51 |
| 2005/0201063 A1 | 9/2005 | Lee et al. | |
| 2005/0204111 A1 | 9/2005 | Natarajan | 711/167 |
| 2005/0207255 A1 | 9/2005 | Perego et al. | |
| 2005/0210196 A1 | 9/2005 | Perego et al. | 711/115 |
| 2005/0223179 A1 | 10/2005 | Perego et al. | 711/154 |
| 2005/0224948 A1 | 10/2005 | Lee et al. | |
| 2005/0232049 A1 | 10/2005 | Park | |
| 2005/0235119 A1 | 10/2005 | Sechrest et al. | 711/158 |
| 2005/0235131 A1 | 10/2005 | Ware | 711/203 |
| 2005/0237838 A1 | 10/2005 | Kwak et al. | 365/222 |
| 2005/0243635 A1 | 11/2005 | Schaefer | 365/227 |
| 2005/0246558 A1 | 11/2005 | Ku | |
| 2005/0249011 A1 | 11/2005 | Maeda | |
| 2005/0259504 A1 | 11/2005 | Murtugh et al. | 365/233 |
| 2005/0263312 A1 | 12/2005 | Bolken et al. | |
| 2005/0265506 A1 | 12/2005 | Foss et al. | 375/376 |
| 2005/0269715 A1 | 12/2005 | Yoo | |
| 2005/0278474 A1 | 12/2005 | Perersen et al. | 711/5 |
| 2005/0281096 A1 | 12/2005 | Bhakta et al. | |
| 2005/0281123 A1 | 12/2005 | Bell et al. | 365/230.08 |
| 2005/0283572 A1 | 12/2005 | Ishihara | |
| 2005/0285174 A1 | 12/2005 | Saito et al. | 257/296 |
| 2005/0286334 A1 | 12/2005 | Saito et al. | |
| 2005/0289292 A1 | 12/2005 | Morrow et al. | 711/105 |
| 2005/0289317 A1 | 12/2005 | Liou et al. | 711/170 |
| 2006/0002201 A1 | 1/2006 | Janzen | 365/191 |
| 2006/0010339 A1 | 1/2006 | Klein | 714/5 |
| 2006/0026484 A1 | 2/2006 | Hollums | 714/746 |
| 2006/0038597 A1 | 2/2006 | Becker et al. | |
| 2006/0039204 A1 | 2/2006 | Cornelius | |
| 2006/0039205 A1 | 2/2006 | Cornelius | 365/189.05 |
| 2006/0041711 A1 | 2/2006 | Miura et al. | 711/103 |
| 2006/0041730 A1 | 2/2006 | Larson | 1/167 |
| 2006/0044909 A1 | 3/2006 | Kinsley et al. | 365/222 |
| 2006/0044913 A1 | 3/2006 | Klein et al. | |
| 2006/0049502 A1 | 3/2006 | Goodwin et al. | |
| 2006/0050574 A1 | 3/2006 | Streif et al. | 365/194 |
| 2006/0056244 A1 | 3/2006 | Ware | 365/194 |
| 2006/0062047 A1 | 3/2006 | Bhakta et al. | |
| 2006/0067141 A1 | 3/2006 | Perego et al. | |
| 2006/0085616 A1 | 4/2006 | Zeighami et al. | 711/167 |
| 2006/0087900 A1 | 4/2006 | Bucksch et al. | |
| 2006/0090031 A1 | 4/2006 | Kirshenbaum et al. | 711/113 |
| 2006/0090054 A1 | 4/2006 | Choi et al. | 711/167 |
| 2006/0106951 A1 | 5/2006 | Bains | 710/5 |
| 2006/0112214 A1 | 5/2006 | Yeh | 711/103 |
| 2006/0112219 A1 | 5/2006 | Chawla et al. | |
| 2006/0117152 A1 | 6/2006 | Amidi et al. | 711/154 |
| 2006/0117160 A1 | 6/2006 | Jackson et al. | 711/170 |
| 2006/0118933 A1 | 6/2006 | Haba | |
| 2006/0120193 A1 | 6/2006 | Casper | |
| 2006/0123265 A1 | 6/2006 | Ruckerbauer et al. | |
| 2006/0126369 A1 | 6/2006 | Raghuram | |
| 2006/0129712 A1 | 6/2006 | Raghuram | 710/52 |
| 2006/0129740 A1 | 6/2006 | Ruckerbauer et al. | |
| 2006/0129755 A1 | 6/2006 | Raghuram | 711/105 |
| 2006/0133173 A1 | 6/2006 | Jain et al. | |
| 2006/0136791 A1 | 6/2006 | Nierle | |
| 2006/0149857 A1 | 7/2006 | Holman | |
| 2006/0149982 A1 | 7/2006 | Vogt | 713/320 |
| 2006/0174082 A1 | 8/2006 | Bellows et al. | |
| 2006/0176744 A1 | 8/2006 | Stave | 365/194 |
| 2006/0179262 A1 | 8/2006 | Brittain et al. | |
| 2006/0179333 A1 | 8/2006 | Brittain et al. | 713/320 |
| 2006/0179334 A1 | 8/2006 | Brittain et al. | 713/320 |

(56) References Cited

U.S. PATENT DOCUMENTS

| | | |
|---|---|---|
| 2006/0180926 A1 | 8/2006 | Mullen et al. |
| 2006/0181953 A1 | 8/2006 | Rotenberg et al. |
| 2006/0195631 A1 | 8/2006 | Rajamani |
| 2006/0198178 A1 | 9/2006 | Kinsley et al. |
| 2006/0203590 A1 | 9/2006 | Mori et al. |
| 2006/0206738 A1 | 9/2006 | Jeddeloh et al. ............... 713/320 |
| 2006/0233012 A1 | 10/2006 | Sekiguchi et al. |
| 2006/0236165 A1 | 10/2006 | Cepulis et al. |
| 2006/0236201 A1 | 10/2006 | Gower et al. |
| 2006/0248261 A1 | 11/2006 | Jacob et al. |
| 2006/0248387 A1 | 11/2006 | Nicholson et al. ............... 714/22 |
| 2006/0262586 A1 | 11/2006 | Solomon et al. |
| 2006/0262587 A1 | 11/2006 | Matsui et al. |
| 2006/0277355 A1 | 12/2006 | Ellsberry et al. |
| 2006/0294295 A1 | 12/2006 | Fukuzo ........................ 711/105 |
| 2007/0005998 A1 | 1/2007 | Jain et al. |
| 2007/0011421 A1 | 1/2007 | Keller et al. |
| 2007/0050530 A1 | 3/2007 | Rajan ................................ 711/5 |
| 2007/0058471 A1 | 3/2007 | Rajan et al. ..................... 365/222 |
| 2007/0070669 A1 | 3/2007 | Tsern |
| 2007/0088995 A1 | 4/2007 | Tsern et al. ..................... 714/724 |
| 2007/0091696 A1 | 4/2007 | Niggemeier et al. |
| 2007/0106860 A1 | 5/2007 | Foster, Sr. et al. ............ 711/170 |
| 2007/0136537 A1 | 6/2007 | Doblar et al. |
| 2007/0152313 A1 | 7/2007 | Periaman et al. |
| 2007/0162700 A1 | 7/2007 | Fortin et al. ................... 711/118 |
| 2007/0188997 A1 | 8/2007 | Hockanson et al. |
| 2007/0192563 A1 | 8/2007 | Rajan et al. ..................... 711/202 |
| 2007/0195613 A1 | 8/2007 | Rajan et al. ............... 365/189.05 |
| 2007/0204075 A1 | 8/2007 | Rajan et al. |
| 2007/0216445 A1 | 9/2007 | Raghavan et al. .............. 326/83 |
| 2007/0247194 A1 | 10/2007 | Jain ................................ 326/87 |
| 2007/0279084 A1 | 12/2007 | Oh et al. |
| 2007/0285895 A1 | 12/2007 | Gruendler et al. |
| 2007/0288683 A1 | 12/2007 | Panabaker et al. ............ 711/101 |
| 2007/0288686 A1 | 12/2007 | Arcedera et al. .............. 711/103 |
| 2007/0288687 A1 | 12/2007 | Panabaker et al. ............ 711/103 |
| 2007/0290333 A1* | 12/2007 | Saini et al. ..................... 257/723 |
| 2008/0002447 A1 | 1/2008 | Gulachenski et al. |
| 2008/0010435 A1 | 1/2008 | Smith et al. |
| 2008/0025108 A1 | 1/2008 | Rajan et al. ............... 365/189.05 |
| 2008/0025122 A1 | 1/2008 | Schakel et al. ................. 365/222 |
| 2008/0025136 A1 | 1/2008 | Rajan et al. ............... 365/230.08 |
| 2008/0025137 A1 | 1/2008 | Rajan et al. ..................... 365/239 |
| 2008/0027697 A1 | 1/2008 | Rajan et al. ..................... 703/14 |
| 2008/0027702 A1 | 1/2008 | Rajan et al. ..................... 703/21 |
| 2008/0027703 A1 | 1/2008 | Rajan et al. ..................... 703/21 |
| 2008/0028135 A1 | 1/2008 | Rajan et al. |
| 2008/0028136 A1 | 1/2008 | Schakel et al. ................. 711/106 |
| 2008/0028137 A1 | 1/2008 | Schakel et al. |
| 2008/0031030 A1 | 2/2008 | Rajan et al. ..................... 365/63 |
| 2008/0031072 A1 | 2/2008 | Rajan et al. ..................... 365/227 |
| 2008/0034130 A1 | 2/2008 | Perego et al. |
| 2008/0037353 A1 | 2/2008 | Rajan et al. ..................... 365/227 |
| 2008/0056014 A1 | 3/2008 | Rajan et al. ............... 365/189.03 |
| 2008/0062773 A1 | 3/2008 | Rajan et al. ............... 365/189.03 |
| 2008/0065820 A1 | 3/2008 | Gillingham et al. ............ 711/105 |
| 2008/0082763 A1 | 4/2008 | Rajan et al. ..................... 711/154 |
| 2008/0086588 A1 | 4/2008 | Danilak et al. |
| 2008/0089034 A1 | 4/2008 | Hoss et al. |
| 2008/0098277 A1 | 4/2008 | Hazelzet |
| 2008/0103753 A1 | 5/2008 | Rajan et al. |
| 2008/0104314 A1 | 5/2008 | Rajan et al. |
| 2008/0109206 A1 | 5/2008 | Rajan et al. |
| 2008/0109595 A1 | 5/2008 | Rajan et al. |
| 2008/0109597 A1 | 5/2008 | Schakel et al. |
| 2008/0109598 A1 | 5/2008 | Schakel et al. |
| 2008/0115006 A1 | 5/2008 | Smith et al. ..................... 713/601 |
| 2008/0120443 A1 | 5/2008 | Rajan et al. |
| 2008/0120458 A1 | 5/2008 | Gillingham et al. ............ 711/105 |
| 2008/0123459 A1 | 5/2008 | Rajan et al. ..................... 365/227 |
| 2008/0126624 A1 | 5/2008 | Prete et al. |
| 2008/0126687 A1 | 5/2008 | Rajan et al. |
| 2008/0126688 A1 | 5/2008 | Rajan et al. |
| 2008/0126689 A1 | 5/2008 | Rajan et al. |
| 2008/0126690 A1 | 5/2008 | Rajan et al. ..................... 711/105 |
| 2008/0126692 A1 | 5/2008 | Rajan et al. |
| 2008/0130364 A1 | 6/2008 | Guterman et al. |
| 2008/0133825 A1 | 6/2008 | Rajan et al. |
| 2008/0155136 A1 | 6/2008 | Hishino |
| 2008/0159027 A1 | 7/2008 | Kim |
| 2008/0170425 A1 | 7/2008 | Rajan |
| 2008/0195894 A1 | 8/2008 | Schreck et al. |
| 2008/0215832 A1 | 9/2008 | Allen et al. |
| 2008/0239857 A1 | 10/2008 | Rajan et al. ..................... 365/227 |
| 2008/0239858 A1 | 10/2008 | Rajan et al. ..................... 365/227 |
| 2008/0256282 A1 | 10/2008 | Guo et al. |
| 2008/0282084 A1 | 11/2008 | Hatakeyama |
| 2008/0282341 A1 | 11/2008 | Hatakeyama |
| 2009/0024789 A1 | 1/2009 | Rajan et al. |
| 2009/0024790 A1 | 1/2009 | Rajan et al. |
| 2009/0049266 A1 | 2/2009 | Kuhne |
| 2009/0063865 A1 | 3/2009 | Berenbaum et al. |
| 2009/0063896 A1 | 3/2009 | Lastras-Montano et al. |
| 2009/0070520 A1 | 3/2009 | Mizushima |
| 2009/0089480 A1 | 4/2009 | Wah et al. |
| 2009/0109613 A1 | 4/2009 | Legen et al. |
| 2009/0180926 A1 | 7/2009 | Petruno et al. |
| 2009/0216939 A1 | 8/2009 | Smith et al. |
| 2009/0285031 A1 | 11/2009 | Rajan et al. |
| 2009/0290442 A1 | 11/2009 | Rajan |
| 2010/0005218 A1 | 1/2010 | Gower et al. |
| 2010/0020585 A1 | 1/2010 | Rajan |
| 2010/0257304 A1 | 10/2010 | Rajan et al. |
| 2010/0271888 A1 | 10/2010 | Rajan |
| 2010/0281280 A1 | 11/2010 | Rajan et al. |

FOREIGN PATENT DOCUMENTS

| | | | |
|---|---|---|---|
| DE | 102005036528 | 2/2007 | ............ G11C 7/10 |
| EP | 0132129 | 1/1985 | |
| EP | 0644547 | 3/1995 | |
| JP | 62121978 | 6/1987 | ............ G06F 12/06 |
| JP | 01171047 | 7/1989 | ............ G06F 12/16 |
| JP | 03-029357 | 2/1991 | ............ H01L 27/04 |
| JP | 03029357 | 2/1991 | ............ H01L 21/822 |
| JP | 03/276487 | 12/1991 | ............ G11C 11/401 |
| JP | 03286234 | 12/1991 | ............ G06F 12/06 |
| JP | 05-298192 | 11/1993 | |
| JP | 07-141870 | 6/1995 | ............ G11C 11/407 |
| JP | 08/077097 | 3/1996 | ............ G06F 13/16 |
| JP | 08077097 | 3/1996 | ............ G06F 12/00 |
| JP | 2008-179994 | 7/1996 | |
| JP | 09-231127 | 9/1997 | |
| JP | 10-233091 | 9/1998 | |
| JP | 10-260895 | 9/1998 | |
| JP | 10233091 | 10/1998 | |
| JP | 11-073773 | 3/1999 | |
| JP | 11-149775 | 6/1999 | ............ G11C 11/407 |
| JP | 11-224221 | 8/1999 | |
| JP | 2002025255 | 1/2002 | ............ G11C 7/10 |
| JP | 3304893 B2 | 5/2002 | |
| JP | 2002-288037 | 10/2002 | |
| JP | 2002288037 | 10/2002 | |
| JP | 04-327474 | 11/2004 | |
| JP | 2005062914 | 3/2005 | |
| JP | 2005108224 | 4/2005 | |
| JP | 2006236388 | 9/2006 | ............ G06F 12/00 |
| KR | 1999-0076659 | 10/1999 | |
| KR | 1020040062717 | 7/2004 | ............ G11C 5/02 |
| KR | 2005120344 | 12/2005 | |
| WO | WO 95/05676 | 2/1995 | ............ H01L 25/00 |
| WO | 07-141870 | 6/1995 | ............ G11C 11/407 |
| WO | WO97/25674 | 7/1997 | |
| WO | WO9900734 | 1/1999 | ............ G11C 7/10 |
| WO | WO00/45270 | 8/2000 | |
| WO | WO01/37090 | 5/2001 | |
| WO | WO00/45270 | 8/2001 | |
| WO | 01/90900 | 11/2001 | |
| WO | 01/97160 | 12/2001 | |
| WO | WO2004/044754 | 5/2004 | |
| WO | WO2004/051645 | 6/2004 | |
| WO | WO2006/072040 | 7/2006 | |
| WO | WO2007002324 | 1/2007 | ............ G11C 29/00 |

(56) References Cited

FOREIGN PATENT DOCUMENTS

| WO | WO2007/028109 | 3/2007 | | |
|---|---|---|---|---|
| WO | WO 2007/038225 | 4/2007 | ............... | G01V 5/00 |
| WO | WO2007/095080 | 8/2007 | | |
| WO | WO2008063251 | 5/2008 | ............... | G11C 5/14 |

OTHER PUBLICATIONS

Kellerbauer "Die Schnelle Million," with translation, "The quick million."
Wu et al., "eNVy: A Non-Volatile, Main Memory Storage System," to appear in ASPLOS VI.
"Using Two Chip Selects to Enable Quad Rank," IP.com PriorArtDatabase, copyright IP.com, Inc. 2004.
"BIOS and Kernel Developer's Guide (BKDG) for AMD Family 10h Processors," AMD, 31116 Rev 3.00, Sep. 7, 2007.
Skerlj et al., "Buffer Device for Memory Modules (DIMM)" Qirnonda 2006, p. 1.
Written Opinion from PCT Application No. PCT/US06/24360 mailed on Jan. 8, 2007.
Preliminary Report on Patentability from PCT Application No. PCT/US06/24360 mailed on Jan. 10, 2008.
Written Opinion from International PCT Application No. PCT/US06/34390 mailed on Nov. 21, 2007.
International Search Report from PCT Application No. PCT/US06/34390 mailed on Nov. 21, 2007.
International Search Report and Written Opinion from PCT Application No. PCT/US07/16385 mailed on Jul. 30, 2008.
Office Action from U.S. Appl. No. 11/461,427 mailed on Sep. 5, 2008.
Final Office Action from U.S. Appl. No. 11/461,430 mailed on Sep. 8, 2008.
Notice of Allowance from U.S. Appl. No. 11/474,075 mailed on Nov. 26, 2008.
Office Action from U.S. Appl. No. 11/474,076 mailed on Nov. 3, 2008.
Office Action from U.S. Appl. No. 11/524,811 mailed on Sep. 17, 2008.
Non-final Office Action from U.S. Appl. No. 11/461,430 mailed on Feb. 19, 2009.
Final Office Action from U.S. Appl. No. 11/461,435 mailed on Jan. 28, 2009.
Non-final Office Action from U.S. Appl. No. 11/461,437 mailed Jan. 26, 2009.
Non-final Office Action from U.S. Appl. No. 11/939,432 mailed on Feb. 6, 2009.
Wu et al,, "eNVy: A Non-Volatile, Main Memory Storage System," ASPLOS-VI Proceedings—Sixth International Conference on Architectural Support for Programming Languages and Operating Systems, San Jose, California, Oct. 4-7, 1994, SIGARCH Computer Architecture News 22(Special Issue Oct. 1994).
Form AO-120 as filed in US Patent No. 7,472,220 on Jun. 17, 2009.
German Office Action From German Patent Application No. 11 2006 002 300.4-55 Mailed Jun. 5, 2009 (With Translation).
Non-Final Office Action From U.S. Appl. No. 11/461,430 Mailed Feb. 19, 2009.
Final Office Action From U.S. Appl. No. 11/461,435 Mailed Jan. 28, 2009.
Non-Final Office Action From U.S. Appl. No. 11/461,441 Mailed Apr. 2, 2009.
Non-Final Office Action From U.S. Appl. No. 11/611,374 Mailed Mar. 23, 2009.
Non-Final Office Action From U.S. Appl. No. 11/762,010 Mailed Mar. 20, 2009.
Non-Final Office Action From U.S. Appl. No. 11/939,432 Mailed Feb. 6, 2009.
Non-Final Office Action From U.S. Appl. No. 12/111,819 Mailed Apr. 27, 2009.
Non-Final Office Action From U.S. Appl. No. 12/111,828 Mailed Apr. 17, 2009.

Supplemental European Search Report and Search Opinion issued on Sep. 21, 2009 in corresponding European Application No. 07870726.2, 8 pages.
Fang et al., W. Power Complexity Analysis of Adiabatic SRAM, 6th Int. Conference on ASIC, vol. 1, Oct. 2005, pp. 334-337.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
German Office Action From German Patent Application No. 11 2006 001 810.8-55 Mailed Apr. 20, 2009 (With Translation).
Final Rejection From U.S. Appl. No. 11/461,437 Mailed Nov. 10, 2009.
Final Rejection from U.S. Appl. No. 11/762,010 Mailed Dec. 4, 2009.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowance From U.S. Appl. No. 11/611,374 Mailed Nov. 30, 2009.
Notice of Allowance From U.S. Appl. No. 11/939,432 Mailed Dec. 1, 2009.
Notice of Allowance From U.S. Appl. No. 12/111,819 Mailed Nov. 20, 2009.
Notice of Allowance From U.S. Appl. No. 12/111,828 Mailed Dec. 15, 2009.
Great Britain Office Action from GB Patent Application No. GB0800734.6 Mailed Mar. 1, 2010.
Final Office Action from U.S. Appl. No. 11/461,420 Mailed Apr. 28, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Non-Final Office Action from U.S. Appl. No. 11/588,739 Mailed Dec. 29, 2009.
Notice of Allowance from U.S. Appl. No. 11/611,374 Mailed Apr. 5, 2010.
Non-Final Office Action from U.S. Appl. No. 11/828,181 Mailed Mar. 2, 2010.
Non-Final Office Action from U.S. Appl. No. 11/828,182 Mailed Mar. 29, 2010.
Final Office Action from U.S. Appl. No. 11/858,518 Mailed Apr. 21, 2010.
Non-Final Office Action from U.S. Appl. No. 11/929,432 Mailed Jan. 14, 2010.
Non-Final Office Action from U.S. Appl. No. 11/929,571 Mailed Mar. 3, 2010.
Non-Final Office Action from U.S. Appl. No. 11/929,631 Mailed Mar. 3, 2010.
Non-Final Office Action from U.S. Appl. No. 11/929,655 Mailed Mar. 3, 2010.
Non-Final Office Action from U.S. Appl. No. 11/939,432 Mailed Apr. 12, 2010.
Notice of Allowance from U.S. Appl. No. 12/111,819 Mailed Mar. 10, 2010.
Non-Final Office Action from U.S. Appl. No. 12/507,682 Mailed Mar. 8, 2010.
Great Britain Office Action from GB Patent Application No. GB0803913.3 Mailed Mar. 1, 2010.
Final Office Action from U.S. Appl. No. 11/461,435 Dated May 13, 2010.
Final Office Action from U.S. Appl. No. 11/515,167 Dated Jun. 3, 2010.
Notice of Allowance from U.S. Appl. No. 11/515,223 Dated Jul. 30, 2010.
Final Office Action from U.S. Appl. No. 11/553,390 Dated Jun. 24, 2010.

(56) References Cited

OTHER PUBLICATIONS

Notice of Allowance from U.S. Appl. No. 11/611,374 Dated Jul. 19, 2010.
Final Office Action from U.S. Appl. No. 11/672,921 Dated Jul. 23, 2010.
Final Office Action from U.S. Appl. No. 11/702,960 Dated Jun. 21, 2010.
Notice of Allowance from U.S. Appl. No. 11/762,010 Dated Jul. 2, 2010.
Notice of Allowance from U.S. Appl. No. 11/763,365 Dated Jun. 29, 2010.
Final Office Action from U.S. Appl. No. 11/929,500 Dated Jun. 24, 2010.
Office Action from U.S. Appl. No. 12/574,628 Dated Jun. 10, 2010.
Non-Final Office Action from U.S. Appl. No. 11/461,420 Dated Jul. 23, 2009.
Notice of Allowance from U.S. Appl. No. 11/461,430 Dated Sep. 9, 2009.
Non-Final Office Action from U.S. Appl. No. 11/461,435 Dated Aug. 5, 2009.
Non-Final Office Action from U.S. Appl. No. 11/515,167 Dated Sep. 25, 2009.
Non-Final Office Action from U.S. Appl. No. 11/515,223 Dated Sep. 22, 2009.
Non-Final Office Action from U.S. Appl. No. 11/538,041 Dated Jun. 10, 2009.
Non-Final Office Action from U.S. Appl. No. 11/553,372 Dated Jun. 25, 2009.
Notice of Allowance from U.S. Appl. No. 11/553,372 Dated Sep. 30, 2009.
Non-Final Office Action from U.S. Appl. No. 11/553,390 Dated Sep. 9, 2009.
Non-Final Office Action from U.S. Appl. No. 11/553,399 Dated Jul. 7, 2009.
Notice of Allowance from U.S. Appl. No. 11/553,399 Dated Oct. 13, 2009.
Notice of Allowance from U.S. Appl. No. 11/611,374 Dated Sep. 15, 2009.
Non-Final Office Action from U.S. Appl. No. 11/702,960 Dated Sep. 25, 2009.
Non-Final Office Action from U.S. Appl. No. 11/702,981 Dated Aug. 19, 2009.
Non-Final Office Action from U.S. Appl. No. 11/762,013 Dated Jun. 5, 2009.
Non-Final Office Action from U.S. Appl. No. 11/763,365 Dated Oct. 28, 2009.
Non-Final Office Action from U.S. Appl. No. 11/858,518 Dated Aug. 14, 2009.
Non-Final Office Action from U.S. Appl. No. 11/929,500 Dated Oct. 13, 2009.
Notice of Allowance from U.S. Appl. No. 11/939,432 Dated Sep. 24, 2009.
Non-Final Office Action from U.S. Appl. No. 11/941,589 Dated Oct. 1, 2009.
Wu et al., "eNVy: A Non-Volatile, Main Memory Storage System", ASPLOS-VI Proceedings, Oct. 4-7, 1994, pp. 86-97.
Buffer Device for Memory Modules (DIMM), IP.com Prior Art Database, <URL: http://ip.com/IPCOM/000144850>, Feb. 10, 2007, 1 pg.
German Office Action from German Patent Application No. 11 2006 002 300.4-55 Dated May 11, 2009 (With Translation).
Great Britain Office Action from GB Patent Application No. GB0803913.3 Dated Mar. 1, 2010.
International Preliminary Examination Report From PCT Application No. PCT/US07/016385 Dated Feb. 3, 2009.
Search Report and Written Opinion From PCT Application No. PCT/US07/03460 Dated on Feb. 14, 2008.
Notice of Allowance from U.S. Appl. No. 11/553,372 Dated Aug. 4, 2010.
Notice of Allowance from U.S. Appl. No. 11/553,399 Dated Dec. 3, 2010.
Notice of Allowance from U.S. Appl. No. 11/611,374 Dated Oct. 29, 2010.
Final Office Action from U.S. Appl. No. 11/672,924 Dated Sep. 7, 2010.
Non-Final Office Action from U.S. Appl. No. 11/702,981 Dated Mar. 11, 2009.
Notice of Allowance from U.S. Appl. No. 11/762,010 Dated Oct. 22, 2010.
Notice of Allowance from U.S. Appl. No. 11/762,013 Dated Aug. 17, 2010.
Notice of Allowance from U.S. Appl. No. 11/762,013 Dated Dec. 7, 2010.
Notice of Allowance from U.S. Appl. No. 11/763,365 Dated Oct. 20, 2010.
Non-Final Office Action from U.S. Appl. No. 11/855,805 Dated Sep. 21, 2010.
Non-Final Office Action from U.S. Appl. No. 11/858,518 Dated Sep. 8, 2010.
Final Office Action from U.S. Appl. No. 11/929,225 Dated Aug. 27, 2010.
Final Office Action from U.S. Appl. No. 11/929,261 Dated Sep. 7, 2010.
Final Office Action from U.S. Appl. No. 11/929,286 Dated Aug. 20, 2010.
Notice of Allowance from U.S. Appl. No. 11/929,320 Dated Sep. 29, 2010.
Final Office Action from U.S. Appl. No. 11/929,403 Dated Aug. 31, 2010.
Final Office Action from U.S. Appl. No. 11/929,417 Dated Aug. 31, 2010.
Final Office Action from U.S. Appl. No. 11/929,432 Dated Aug. 20, 2010.
Final Office Action from U.S. Appl. No. 11/929,450 Dated Aug. 20, 2010.
Notice of Allowance from U.S. Appl. No. 11/929,483 Dated Oct. 7, 2010.
Final Office Action from U.S. Appl. No. 11/929,631 Dated Nov. 18, 2010.
Final Office Action from U.S. Appl. No. 11/929,655 Dated Nov. 22, 2010.
Non-Final Office Action from U.S. Appl. No. 11/939,440 Dated Sep. 17, 2010.
Notice of Allowance from U.S. Appl. No. 11/941,589 Dated Oct. 25, 2010.
Non-Final Office Action from U.S. Appl. No. 12/057,306 Dated Oct. 8, 2010.
Non-Final Office Action from U.S. Appl. No. 12/203,100 Dated Dec. 1, 2010.
Non-Final Office Action from U.S. Appl. No. 12/769,428 Dated Nov. 8, 2010.
Non-Final Office Action from U.S. Appl. No. 12/838,896 Dated Sep. 3, 2010.
Search Report From PCT Application No. PCT/US10/038041 Dated Aug. 23, 2010.
Non-Final Office Action from U.S. Appl. No. 11/461,437 Dated Jan. 4, 2011.
Notice of Allowance from U.S. Appl. No. 11/515,223 Dated Feb. 4, 2011.
Non-Final Office Action from U.S. Appl. No. 11/553,372 Dated Jan. 5, 2011.
Final Office Action from U.S. Appl. No. 11/588,739 Dated Dec. 15, 2010.
Notice of Allowance from U.S. Appl. No. 11/762,010 Dated Feb. 18, 2011.
Final Office Action from U.S. Appl. No. 11/828,182 Dated Dec. 22, 2010.
Non-Final Office Action from U.S. Appl. No. 11/855,826 Dated Jan. 13, 2011.
Notice of Allowance from U.S. Appl. No. 11/939,432 Dated Feb. 18, 2011.

(56) References Cited

OTHER PUBLICATIONS

Notice of Allowance from U.S. Appl. No. 12/144,396 Dated Feb. 1, 2011.
Non-Final Office Action from U.S. Appl. No. 12/816,756 Dated Feb. 7, 2011.
Notice of Allowance from U.S. Appl. No. 11/762,013 Dated Feb. 22, 2011.
Notice of Allowance from U.S. Appl. No. 11/929,500 Dated Feb. 24, 2011.
Notice of Allowance from U.S. Appl. No. 11/763,365 Dated Mar. 1, 2011.
Final Office Action from U.S. Appl. No. 12/574,628 Dated Mar. 3, 2011.
Final Office Action from U.S. Appl. No. 11/929,571 Dated Mar. 3, 2011.
Notice of Allowance from U.S. Appl. No. 11/611,374 Dated Mar. 4, 2011.
Notice of Allowance from U.S. Appl. No. 11/929,483 Dated Mar. 4, 2011.
Notice of Allowance from U.S. Appl. No. 11/553,399 Dated Mar. 18, 2011.
Final Office Action from U.S. Appl. No. 12/507,682 Dated Mar. 29, 2011.
Non-Final Office Action from U.S. Appl. No. 11/929,403 Dated Mar. 31, 2011.
Office Action from U.S. Appl. No. 11/929,417 Dated Mar. 31, 2011.
Notice of Allowance from U.S. Appl. No. 12/838,896 Dated Apr. 19, 2011.
Notice of Allowance from U.S. Appl. No. 11/702,981 Dated Apr. 25, 2011.
Notice of Allowance from U.S. Appl. No. 11/929,320 Dated May 5, 2011.
Final Office Action from U.S. Appl. No. 11/939,440 Dated May 19, 2011.
Final Office Action from U.S. Appl. No. 11/855,805, Dated May 26, 2011.
Non-Final Office Action from U.S. Appl. No. 11/672,921 Dated May 27, 2011.
Notice of Allowance from U.S. Appl. No. 11/762,010 Dated Jun. 8, 2011.
Non-Final Office Action from U.S. Appl. No. 11/672,924 Dated Jun. 8, 2011.
Non-Final Office Action from U.S. Appl. No. 11/929,225 Dated Jun. 8, 2011.
Notice of Allowance from U.S. Appl. No. 11/929,500 Dated Jun. 13, 2011.
Notice of Allowance from U.S. Appl. No. 11/941,589 Dated Jun. 15, 2011.
Final Office Action from U.S. Appl. No. 12/057,306 Dated Jun. 15, 2011.
Final Office Action from U.S. Appl. No. 12/769,428 Dated Jun. 16, 2011.
Notice of Allowance from U.S. Appl. No. 12/203,100 Dated Jun. 17, 2011.
Notice of Allowance from U.S. Appl. No. 11/762,013 Dated Jun. 20, 2011.
Non-Final Office Action from U.S. Appl. No. 12/797,557 Dated Jun. 21, 2011.
Notice of Allowance from U.S. Appl. No. 11/929,483 Dated Jun. 23, 2011.
Non-Final Office Action from U.S. Appl. No. 11/702,960 Dated Jun. 23, 2011.
Non-Final Office Action from U.S. Appl. No. 11/929,655 Dated Jun. 24, 2011.
Notice of Allowance from U.S. Appl. No. 11/763,365 Dated Jun. 24, 2011.
Notice of Allowance from U.S. Appl. No. 11/611,374 Dated Jun. 24, 2011.
Non-Final Office Action from U.S. Appl. No. 11/828,182 Dated Jun. 27, 2011.
Non-Final Office Action from U.S. Appl. No. 11/828,181 Dated Jun. 27, 2011.
Non-Final Office Action from U.S. Appl. No. 12/378,328 Dated Jul. 15, 2011.
Final Office Action from U.S. Appl. No. 11/461,420 Dated Jul. 20, 2011.
Notice of Allowance from U.S. Appl. No. 11/461,437 Dated Jul. 25, 2011.
Notice of Allowance from U.S. Appl. No. 11/702,981 Dated Aug. 5, 2011.
Notice of Allowability from U.S. Appl. No. 11/855,826 Dated Aug. 15, 2011.
Non-Final Office Action from U.S. Appl. No. 12/574,628 Dated Sep. 20, 2011.
Non-Final Office Action from U.S. Appl. No. 11/858,518 Dated Sep. 27, 2011.
Notice of Allowance from U.S. Appl. No. 11/929,571 Dated Sep. 27, 2011.
Notice of Allowance from U.S. Appl. No. 11/929,500 Dated Sep. 27, 2011.
Notice of Allowance from U.S. Appl. No. 11/941,589 Dated Sep. 30, 2011.
Notice of Allowance from U.S. Appl. No. 12/816,756 Dated Oct. 3, 2011.
Non-Final Office Action from U.S. Appl. No. 12/508,496 Dated Oct. 11, 2011.
Non-Final Office Action from U.S. Appl. No. 11/588,739 Dated Oct. 13, 2011.
Notice of Allowance from U.S. Appl. No. 11/939,432 Dated Oct. 24, 2011.
Non-Final Office Action from U.S. Appl. No. 11/929,631 Dated Nov. 1, 2011.
Non-Final Office Action from U.S. Appl. No. 11/553,372 Dated Nov. 14, 2011.
Notice of Allowance from U.S. Appl. No. 11/515,223 Dated Nov. 29, 2011.
Notice of Allowance from U.S. Appl. No. 12/769,428 Dated Nov. 29, 2011.
Final Office Action from U.S. Appl. No. 11/939,440 Dated Dec. 12, 2011.
Notice of Allowance from U.S. Appl. No. 12/797,557 Dated Dec. 28, 2011.
Office Action, including English translation, from related Japanese application No. 2008-529353, Dated Jan. 10, 2012.
Notice of Allowance from U.S. Appl. No. 12/838,896 Dated Jan. 18, 2012.
Final Office Action from U.S. Appl. No. 11/929,655 Dated Jan. 19, 2012.
Final Office Action from U.S. Appl. No. 12/378,328 Dated Feb. 3, 2012.
Final Office Action from U.S. Appl. No. 11/672,921 Dated Feb. 16, 2012.
Final Office Action from U.S. Appl. No. 11/672,924 Dated Feb. 16, 2012.
Final Office Action from U.S. Appl. No. 11/929,225 Dated Feb. 16, 2012.
Final Office Action from U.S. Appl. No. 11/828,181 Dated Feb. 23, 2012.
Non-Final Office Action from U.S. Appl. No. 13/276,212 Dated Mar. 15, 2012.
Office Action, including English translation, from co-pending Japanese application No. 2008-529353, Dated Jan. 10, 2012.
International Search Report for Application No. EP12150807 Dated Feb. 16, 2012.
Non-Final Office Action from U.S. Appl. No. 11/461,520 Dated Feb. 29, 2012.
Notice of Allowance from U.S. Appl. No. 12/574,628 Dated Mar. 6, 2012.
Non-Final Office Action from U.S. Appl. No. 13/343,612 Dated Mar. 29, 2012.
Notice of Allowance from U.S. Appl. No. 11/939,440 Dated Mar. 30, 2012.

(56) References Cited

OTHER PUBLICATIONS

European Search Report from co-pending European application No. 11194876.6-2212/2450798, Dated Apr. 12, 2012.
European Search Report from co-pending European application No. 11194862.6-2212/2450800, Dated Apr. 12, 2012.
Notice of Allowance from U.S. Appl. No. 11/929,636, Dated Apr. 17, 2012.
Final Office Action from U.S. Appl. No. 11/858,518, Dated Apr. 17, 2012.
European Search Report from co-pending European application No. 11194883.2-2212, Dated Apr. 27, 2012.
Non-Final Office Action from U.S. Appl. No. 11/553,372, Dated May 3, 2012.
Notice of Allowance from U.S. Appl. No. 11/929,631, Dated May 3, 2012.
Non-Final Office Action from U.S. Appl. No. 13/165,713, Dated May 22, 2012.
Non-Final Office Action from U.S. Appl. No. 12/144,396, Dated May 29, 2012.
Non-Final Office Action from U.S. Appl. No. 13/165,713, Dated May 31, 2012.
Non-Final Office Action from U.S. Appl. No. 13/280,251, Dated Jun. 12, 2012.
Final Office Action from U.S. Appl. No. 11/855,805, Dated Jun. 14, 2012.
English translation of Office Action from co-pending Korean patent application No. KR1020087019582, Dated Mar. 13, 2013.
Notice of Allowance from U.S. Appl. No. 13/618,246, Dated Apr. 23, 2013.
Notice of Allowance from U.S. Appl. No. 13/182,234, Dated May 1, 2013.
Final Office Action from U.S. Appl. No. 13/315,933, Dated May 3, 2013.
English Translation of Office Action from co-pending Korean patent application No. 10-2013-7004006, Dated Apr. 12, 2013.
EPO Communication for Co-pending European patent application No. EP11194862.6, dated May 5, 2013.
Non-Final Office Action from U.S. Appl. No. 13/620,565, Dated May 24, 2013.
Final Office Action from U.S. Appl. No. 11/929,225, Dated May 24, 2013.
Final Office Action from U.S. Appl. No. 11/672,921, Dated May 24, 2013.
Notice of Allowance from U.S. Appl. No. 11/929,631, Dated May 28, 2013.
Notice of Allowance from U.S. Appl. No. 13/620,424, Dated May 29, 2013.
Notice of Allowance from U.S. Appl. No. 13/341,844, Dated May 30, 2013.
Non-Final Office Action from U.S. Appl. No. 13/455,691, Dated Jun. 4, 2013.
Non-Final Office Action from U.S. Appl. No. 13/620,199, Dated Jun. 17, 2013.
Non-Final Office Action from U.S. Appl. No. 13/620,207, Dated Jun. 20, 2013.
Non-Final Office Action from U.S. Appl. No. 11/828,182, Dated Jun. 20, 2013.
Final Office Action from U.S. Appl. No. 11/828,181, Dated Jun. 20, 2013.
Non-Final Office Action from U.S. Appl. No. 11/929,655, Dated Jun. 21, 2013.
Notice of Allowance from U.S. Appl. No. 13/597,895, Dated Jun. 25, 2013.
Non-Final Office Action from U.S. Appl. No. 13/620,645, Dated Jun. 26, 2013.
Notice of Allowance from U.S. Appl. No. 13/471,283, Dated Jun. 28, 2013.
Notice of Allowance from U.S. Appl. No. 13/181,747, Dated Jul. 9, 2013.
Notice of Allowance from U.S. Appl. No. 11/515,223, Dated Jul. 18, 2013.
Notice of Allowance from U.S. Appl. No. 13/182,234, Dated Jul. 22, 2013.
Notice of Allowance from U.S. Appl. No. 13/181,716, Dated Jul. 22, 2013.
Non-Final Office Action from U.S. Appl. No. 13/620,233, Dated Aug. 2, 2013.
Final Office Action from U.S. Appl. No. 13/367,182, Dated Aug. 8, 2013.
Notice of Allowance from U.S. Appl. No. 13/615,008, Dated Aug. 15, 2013.
Notice of Allowance from U.S. Appl. No. 13/620,425, Dated Aug. 20, 2013.
Non-Final Office Action from U.S. Appl. No. 13/620,601, Dated Aug. 23, 2013.
Non-Final Office Action from U.S. Appl. No. 12/507,683, Dated Aug. 27, 2013.
Non-Final Office Action from U.S. Appl. No. 13/315,933, Dated Aug. 27, 2013.
Final Office Action from U.S. Appl. No. 13/620,650, Dated Aug. 30, 2013.
Notice of Allowance from U.S. Appl. No. 13/620,424, Dated Sep. 11, 2013.
Non-Final Office Action from U.S. Appl. No. 13/620,291, Dated Sep. 12, 2013.
Notice of Allowance from U.S. Appl. No. 13/341,844, Dated Sep. 17, 2013.
Notice of Allowance from U.S. Appl. No. 13/620,412, dated Sep. 25, 2013.
Non-Final Office Action from U.S. Appl. No. 13/343,852, dated Sep. 27, 2013.
English Translation of Office Action from co-pending Korean patent application No. 10-2008-7019582, dated Sep. 16, 2013.
Notice of Allowance from U.S. Appl. No. 13/620,565, dated Sep. 27, 2013.
Non-Final Office Action from U.S. Appl. No. 13/279,068, dated Sep. 30, 2013.
Notice of Allowance from U.S. Appl. No. 13/620,207, dated Oct. 9, 2013.
Non-Final Office Action from U.S. Appl. No. 13/898,002, dated Oct. 10, 2013.
Notice of Allowance from U.S. Appl. No. 13/471,283, dated Oct. 15, 2013.
Notice of Allowance from U.S. Appl. No. 11/515,223, dated Oct. 24, 2013.
Notice of Allowance from U.S. Appl. No. 13/181,747, dated Oct. 28, 2013.
Notice of Allowance from U.S. Appl. No. 13/597,895, dated Oct. 29, 2013.
Notice of Allowance from U.S. Appl. No. 13/620,199, dated Nov. 13, 2013.
Notice of Allowance from U.S. Appl. No. 13/618,246, dated Nov. 14, 2013.
Notice of Allowance from U.S. Appl. No. 13/473,827, dated Nov. 20, 2013.
Notice of Allowance from U.S. Appl. No. 13/615,008, dated Dec. 3, 2013.
Notice of Allowance from U.S. Appl. No. 13/620,425, dated Dec. 11, 2013.
English Translation of Office Action from co-pending Japanese patent application No. P2012-197675, Dec. 3, 2013.
English Translation of Office Action from co-pending Japanese patent application No. P2012-197678, Dec. 3, 2013.
Notice of Allowance from U.S. Appl. No. 13/455,691, dated Dec. 31, 2013.
Non-Final Office Action from U.S. Appl. No. 11/553,390, dated Dec. 31, 2013.
English Translation of Office Action from co-pending Korean patent application No. 10-2013-7004006, dated Dec. 26, 2013.
Search Report from co-pending European Patent Application No. 13191794, dated Dec. 12, 2013.

(56) References Cited

OTHER PUBLICATIONS

Notice of Allowance from U.S. Appl. No. 13/620,425, dated Jan. 13, 2014.
Office Action from co-pending Korean patent application No. 10-2013-7029741, dated Dec. 20, 2013.
English Translation of Office Action from co-pending Japanese patent application No. 2012-132119, dated Jan. 7, 2014.
Notice of Allowance from U.S. Appl. No. 13/279,068, dated Jan. 21, 2014.
Notice of Allowance from U.S. Appl. No. 13/620,412, dated Jan. 21, 2014.
Non-Final Office Action from U.S. Appl. No. 13,367,182, dated Jan. 29, 2014.
Notice of Allowance from U.S. Appl. No. 13/898,002, dated Feb. 3, 2014.
Search Report from co-pending European Patent Application No. 13191796, dated Feb. 10, 2014.
Notice of Allowance from U.S. Appl. No. 13/620,424, dated Feb. 11, 2014.
Notice of Allowance from U.S. Appl. No. 13/620,565, dated Feb. 24, 2014.
Notice of Allowance from U.S. Appl. No. 13/315,933, dated Feb. 26, 2014.
Final Office Action from U.S. Appl. No. 13/620,601, dated Mar. 3, 2014.
Notice of Allowance from U.S. Appl. No. 13/620,207, dated Mar. 6, 2014.
Office Action, including English translation, from co-pending Japanese application No. 2008-529353, Dated Jul. 31, 2012.
Final Office Action from U.S. Appl. No. 13/315,933, Dated Aug. 24, 2012.
Final Office Action from U.S. Appl. No. 13/276,212, Dated Aug. 30, 2012.
Non-Final Office Action from U.S. Appl. No. 13/367,182, Dated Aug. 31, 2012.
Notice of Allowance from U.S. Appl. No. 11/461,420, Dated Sep. 5, 2012.
Final Office Action from U.S. Appl. No. 13/280,251, Dated Sep. 12, 2012.
Non-Final Office Action from U.S. Appl. No. 11/929,225, Dated Sep. 17, 2012.
Notice of Allowance from U.S. Appl. No. 12/508,496, Dated Sep. 17, 2012.
Non-Final Office Action from U.S. Appl. No. 11/672,921, Dated Oct. 1, 2012.
Notice of Allowance from U.S. Appl. No. 12/057,306, Dated Oct. 10, 2012.
Notice of Allowance from U.S. Appl. No. 12/144,396, Dated Oct. 11, 2012.
Non-Final Office Action from U.S. Appl. No. 13/411,489, Dated Oct. 17, 2012.
Non-Final Office Action from U.S. Appl. No. 13/471,283, Dated Dec. 7, 2012.
English translation of Office Action from co-pending Korean patent application No. KR1020087005172, dated Dec. 20, 2012.
Office Action, including English translation, from co-pending Japanese application No. 2008-529353, Dated Dec. 27, 2012.
Office Action from co-pending European patent application No. EP12150798, Dated Jan. 3, 2013.
Final Office Action from U.S. Appl. No. 11/672,924, Dated Feb. 1, 2013.
Non-Final Office Action from U.S. Appl. No. 13/260,650, Dated Feb. 1, 2013.
Notice of Allowance from U.S. Appl. No. 13/141,844, Dated Feb. 5, 2013.
Notice of Allowance from U.S. Appl. No. 13/473,827, Dated Feb. 15, 2013.
Notice of Allowance from U.S. Appl. No. 12/378,328, Dated Feb. 27, 2013.
Non-Final Office Action from U.S. Appl. No. 13/536,093, Dated Mar. 1, 2013.
Notice of Allowance from U.S. Appl. No. 11/461,435, Dated Mar. 6, 2013.
Notice of Allowance from U.S. Appl. No. 13/471,283, Dated Mar. 21, 2013.
Extended European Search Report for co-pending European patent application No. EP12150807.1, dated Feb. 1, 2013, mailed Mar. 22, 2013.
Notice of Allowance from U.S. Appl. No. 13/181,716, Dated Apr. 3, 2013.
Notice of Allowance from U.S. Appl. No. 13/455,691, dated Mar. 10, 2014.
Notice of Allowance from U.S. Appl. No. 13/620,199, dated Mar. 11, 2014.
Notice of Allowance from U.S. Appl. No. 13/620,425, dated Mar. 31, 2014.
Final Office Action from U.S. Appl. No. 13/367,182, dated Apr. 1, 2014.
Final Office Action from U.S. Appl. No. 12/507,682, dated Apr. 2, 2014.
Notice of Allowance from U.S. Appl. No. 11/515,167, dated Apr. 2, 2014.
Final Office Action from U.S. Appl. No. 13/343,852, dated Apr. 18, 2014.
Final Office Action from U.S. Appl. No. 11/672,924, dated May 8, 2014.
Office Action from co-pending Korean patent application No. 10-2014-7005128, dated Apr. 10, 2014.
Notice of Allowance from U.S. Appl. No. 13/620,565, dated Jun. 4, 2014.
Non-Final Office Action from U.S. Appl. No. 11/553,390, dated Jul. 8, 2014.
Notice of Allowance from U.S. Appl. No. 13/367,182, dated Jul. 18, 2014.
Non-Final Office Action from U.S. Appl. No. 14/090,342, dated Aug. 13, 2014.
Notice of Allowance from U.S. Appl. No. 13/620,601, dated Aug. 13, 2014.
Office Action from Japanese Application No. JP2012-197678, dated Jul. 29, 2014.
Office Action from Japanese Application No. JP2012-197675, dated Jul. 29, 2014.
Notice of Allowance from U.S. Appl. No. 12/507,682, dated Sep. 26, 2014.
Notice of Allowance from U.S. Appl. No. 11/553,390, dated Nov. 21, 2014.
Notice of Allowance from U.S. Appl. No. 14/090,342, dated Dec. 11, 2014.

\* cited by examiner

HYBRID MEMORY MODULE

CROSS-REFERENCE TO RELATED APPLICATIONS

This application is a continuation of U.S. patent application Ser. No. 12/057,306, filed Mar. 27, 2008, now U.S. Pat. No. 8,397,013, which is a continuation-in-part of U.S. patent application Ser. No. 11/611,374, filed Dec. 15, 2006, now U.S. Pat. No. 8,055,833, which also claims benefit of U.S. Provisional Patent Application Ser. No. 60/849,631, filed Oct. 5, 2006, all of which are herein incorporated by reference.

BACKGROUND OF THE INVENTION

1. Field of the Invention

Embodiments of the present invention generally relate to memory modules and, more specifically, to hybrid or mixed-technology memory modules.

2. Description of the Related Art

Memory systems in computers are typically built from memory modules. An example of a common type of memory module is a Dual Inline Memory Module or DIMM. The most common type of memory module is a DIMM that contains just one type of memory technology known as DRAM.

There are several new forms of semiconductor memory that are currently being developed, some as potential replacements for one-transistor-cell DRAM. Examples are Magnetoresistive Random Access Memory (MRAM), Phase-change memory (also known as PCM, PRAM, PCRAM, Ovonic Unified Memory and Chalcogenide RAM or C-RAM), Ferroelectric RAM (FRAM), Resistor RAM (RRAM), and Molecular Wire Crossbar Memory (MWCM). Most of these new memory technologies have system properties (most notably the read and write bandwidth and read and write latency) that are different from DRAM. In addition there are several flash memory technologies, such as NAND and NOR flash, that are attractive (because of their high density and low cost) for use as system memory, but again have system properties that are different from DRAM. Therefore, an ideal memory module would incorporate different types of memory while having a single memory interface with a host computer.

As the foregoing illustrates, what is needed in the art is a mixed-technology memory module architecture that combines different memory technologies while presenting a single, preferably standard, technology interface.

SUMMARY OF THE INVENTION

One embodiment of the present invention sets forth a hybrid memory module comprising a plurality of super-stacks and a first interface configured to transmit data between the plurality of super-stacks and a memory controller. Each super-stack includes a plurality of sub-stacks, a super-controller configured to control the plurality of sub-stacks, and a second interface configured to transmit data between the plurality of sub-stacks and the first interface.

One advantage of the disclosed hybrid memory module is that combining memory devices of different types allows utilizing the favorable properties of each type of the memory devices, while hiding their unfavorable properties from the memory controller. More specifically, combining slow memory devices and fast memory devices using the architecture of the hybrid memory module allows the long latency of the slow memory devices to be hidden, so that the hybrid memory module appears to the memory controller as a standard fast memory device characterized by having low latency.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention disclosed herein describe how to build standard DIM Ms that contain more than one type of memory technology. An example of a mixed-technology DIMM is a module that combines flash memory with SRAM.

Figure 1A:
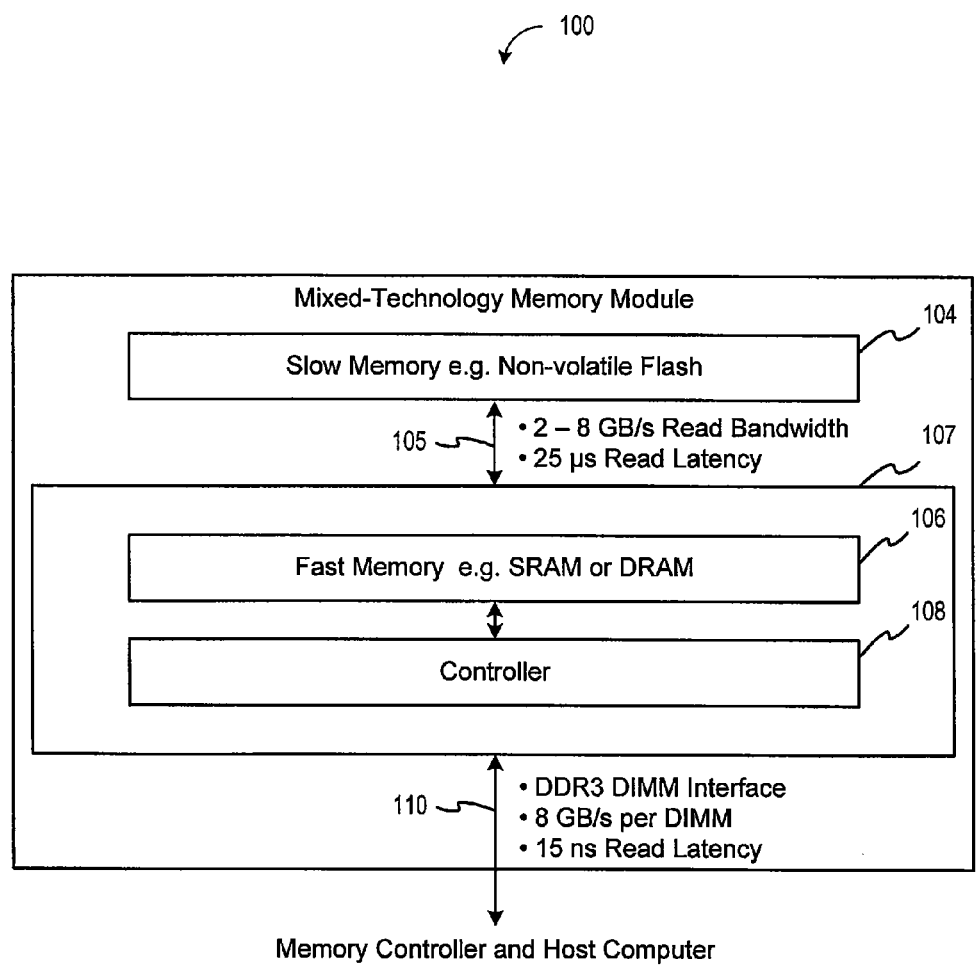
FIG. 1A shows an abstract and conceptual model of a mixed-technology memory module, according to one embodiment.

FIG. 1A shows an abstract and conceptual model of a mixed-technology memory module, according to one embodiment.

The mixed-technology memory module 100 shown in FIG. 1A has both slow memory and fast memory, with the combination architected so as to appear to a host computer as fast memory using a standard interface. The specific embodiment of the mixed-technology memory module 100, which will also be referred to as a HybridDIMM 100, shows both slow, non-volatile memory portion 104 (e.g. flash memory), and a latency-hiding buffer using fast memory 106 (e.g. using SRAM, DRAM, or embedded DRAM volatile memory), together with a controller 108. As shown in FIG. 1A, the combination of the fast and slow memory is presented to a host computer over a host interface 110 (also referred to herein as a DIMM interface 110) as a JEDEC-compatible standard DIMM. In one embodiment, the host interface 110 may communicate data between the mixed-technology memory module 100 and a memory controller within a host computer. The host interface 110 may be a standard DDR3 interface, for example. The DDR3 interface provides approximately 8 gigabyte/s read/write bandwidth per DIMM and a 15 nanosecond read latency when a standard DIMM uses standard DDR3 SDRAM. The host interface 110 may present any other JEDEC-compatible interface, or even, the host interface may present to the host system via a custom interface, and/or using a custom protocol.

The DDR3 host interface is defined by JEDEC as having 240 pins including data, command, control and clocking pins (as well as power and ground pins). There are two forms of the standard JEDEC DDR3 host interface using compatible 240-pin sockets: one set of pin definitions for registered DIMMs (R-DIMMs) and one set for unbuffered DIMMs (U-DIMMs). There are currently no unused or reserved pins in this JEDEC DDR3 standard. This is a typical situation in high-speed JEDEC standard DDR interfaces and other memory interfaces—that is normally all pins are used for very specific functions with few or no spare pins and very little flexibility in the use of pins. Therefore, it is advantageous and preferable to create a HybridDIMM that does not require any extra pins or signals on the host interface and uses the pins in a standard fashion.

In FIG. 1A, an interface 105 to the slow memory 104 may provide read bandwidth of 2-8 gigabyte/s with currently available flash memory chips depending on the exact number and arrangement of the memory chips on the HybridDIMM. Other configurations of the interface 105 are possible and envisioned by virtue of scaling the width and/or the signaling speed of the interface 105. However, in general, the slow memory 104, such as non-volatile memory (e.g. standard NAND flash memory), provides a read latency that is much longer than the read latency of the fast memory 106, such as DDR3 SDRAM, e.g. 25 microseconds for current flash chips versus 15 nanoseconds for DDR3 SDRAM.

The combination of the fast memory 106 and the controller 108, shown as an element 107 in FIG. 1A, allows the "bad" properties of the slow memory 104 (e.g. long latency) to be hidden from the memory controller and the host computer. When the memory controller performs an access to the mixed-technology memory module 100, the memory controller sees the "good" (e.g. low latency) properties of the fast memory 106. The fast memory 106 thus acts as a latency-hiding component to buffer the slow memory 104 and enable the HybridDIMM 100 to appear as if it were a standard memory module built using only the fast memory 106 operating on a standard fast memory bus.

Figure 1B:
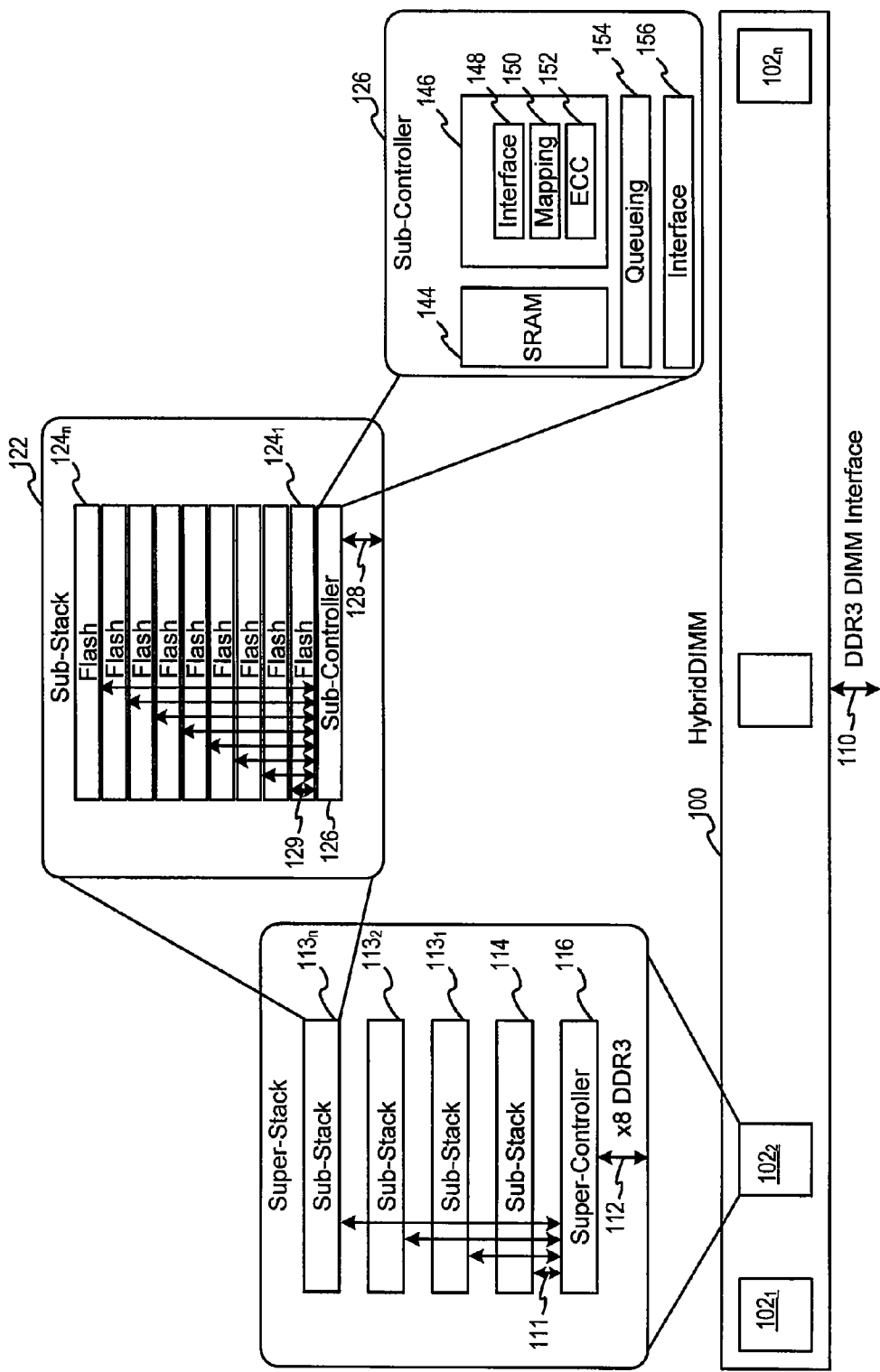
FIG. 1B is an exploded hierarchical view of a logical model of a HybridDIMM, according to one embodiment.

FIG. 1B is an exploded hierarchical view of a logical model of the HybridDIMM 100, according to one embodiment. While FIG. 1A depicts an abstract and conceptual model of the HybridDIMM 100, FIG. 1B is a specific embodiment of the HybridDIMM 100. FIG. 1B replaces the simple view of a single block of slow memory (the slow memory 104 in FIG. 1A) with a number of sub-assemblies or Sub-Stacks 122 that contain the slow memory (flash memory components 124). FIG. 1B also replaces the simple view of a single block of fast memory (the fast memory 106 in FIG. 1A) by SRAM 144 in a number of Sub-Controllers 126. Further, the simple view of a single controller (the controller 108 in FIG. 1A) is replaced now in FIG. 1B by the combination of a Super-Controller 116 and a number of Sub-Controllers 126. Of course, the particular HybridDIMM architecture shown in FIG. 1B is just one of many possible implementations of the more general architecture shown in FIG. 1A.

In the embodiment shown in FIG. 1B, the slow memory portion in the Sub-Stack 122 may use NAND flash, but, in alternative embodiments, could also use NOR flash, or any other relatively slow (relative to DRAM) memory. Also, in the embodiment shown in FIG. 1B, the fast memory in the Sub-Controller 126 comprises an SRAM 144, but could be comprised of DRAM, or embedded DRAM, or any other relatively fast (relative to flash) memory etc. Of course it is typical that memory made by use of differing technologies will exhibit different bandwidths and latencies. Accordingly, as a function of the overall architecture of the HybridDIMM 100, and in particular as a function of the Super-Controller 116, the differing access properties (including latency and bandwidth) inherent in the use of different memories are managed by logic. In other words, even though there may exist the situation where a one memory word is retrieved from (for example) SRAM, and another memory value retrieved from (for example) flash memory, the memory controller of the host computer (not shown) connected to the interface 110 is still presented with signaling and protocol as defined for just one of the aforementioned memories. For example, in the case that the memory controller requests a read of two memory words near a page boundary, 8 bits of data may be read from a memory value retrieved from (for example) SRAM 144, and 8 bits of data may be read from a memory value retrieved from (for example) the flash memory component 124.

Stated differently, any implementation of the HybridDIMM 100, may use at least two different memory technologies combined on the same memory module, and, as such, may use the lower latency fast memory as a buffer in order to mask the higher latency slow memory. Of course the foregoing combination is described as occurring on a single memory module, however the combination of a faster memory and a slower memory may be presented on the same bus, regardless of how the two types of memory are situated in the physical implementation.

The abstract model described above uses two types of memory on a single DIMM. Examples of such combinations include using any of DRAM, SRAM, flash, or any volatile or nonvolatile memory in any combination, but such combinations not limited to permutations involving only two memory types. For example, it is also possible to use SRAM, DRAM and flash memory circuits together in combination on a single mixed-technology memory module. In various embodiments, the HybridDIMM 100 may use on-chip SRAM together with DRAM to form the small but fast memory combined together with slow but large flash memory circuits in combination on a mixed-technology memory module to emulate a large and fast standard memory module.

Continuing into the hierarchy of the HybridDIMM 100, FIG. 1B shows multiple Super-Stack components $102_1$-$102_n$ (also referred to herein as Super-Stacks 102). Each Super-Stack 102 has an interface 112 that is shown in FIG. 1B as an 8-bit wide interface compatible with DDR3 SDRAMs with x8 organization, providing 8 bits to the DIMM interface 110. For example nine 8-bit wide Super-Stacks 102 may provide the 72 data bits of a DDR3 R-DIMM with ECC. Each Super-Stack 102 in turn comprises a Super-Controller 116 and at least one Sub-Stack 114. Additional Sub-Stacks $113_1$-$113_n$ (also referred to herein as Sub-Stacks 113) may be optionally disposed within any one or more of the Super-Stack components $102_1$-$102_n$.

The Sub-Stack 122 in FIG. 1B, intended to illustrate components of any of the Sub-Stack 114 or the additional Sub-Stacks 113, is comprised of a Sub-Controller 126 and at least one slow memory component, for example a plurality of flash memory components $124_1$-$124_n$ (also referred to herein as flash memory components 124). Further continuing into the hierarchy of the HybridDIMM 100, the Sub-Controller 126 may include fast memory, such as the SRAM 144, queuing logic 154, interface logic 156 and one or more flash controller(s) 146 which may provide functions such as interface logic 148, mapping logic 150, and error-detection and error-correction logic 152.

In preferred embodiments, the HybridDIMM 100 contains nine or eighteen Super-Stacks 102, depending for example, if the HybridDIMM 100 is populated on one side (using nine Super-Stacks 102) of the HybridDIMM 100 or on both sides (using eighteen Super-Stacks 102). However, depending on the width of the host interface 110 and the organization of the Super-Stacks 102 (and, thus, the width of the interface 112), any number of Super-Stacks 102 may be used. As mentioned earlier, the Super-Controllers 116 are in electrical communication with the memory controller of the host computer through the host interface 110, which is a JEDEC DDR3-compliant interface.

The number and arrangement of Super-Stacks 102, Super-Controllers 116, and Sub-Controllers 126 depends largely on the number of flash memory components 124. The number of flash memory components 124 depends largely on the bandwidth and the capacity required of the HybridDIMM 100. Thus, in order to increase capacity, a larger number and/or larger capacity flash memory components 124 may be used. In order to increase bandwidth the flash memory components 124 may be time-interleaved or time-multiplexed, which is one of the functions of the Sub-Controller 126. If only a small-capacity and low-bandwidth HybridDIMM 100 is required, then it is possible to reduce the number of Sub-Controllers 126 to one and merge that function together with the Super-Controller 116 in a single chip, possibly even merged together with the non-volatile memory. Such a small, low-bandwidth HybridDIMM 100 may be useful in laptop or desktop computers for example, or in embedded systems. If a large-capacity and high-bandwidth HybridDIMM 100 is required, then a number of flash memory components 124 may be connected to one or more of the Sub-Controller 126 and the Sub-Controllers 126 connected to the Super-Controller 116. In order to describe the most general form of HybrdDIMM 100, the descriptions below will focus on the Hybrid-DIMM 100 with separate Super-Controller 116 and multiple Sub-Controllers 126.

Figure 2:
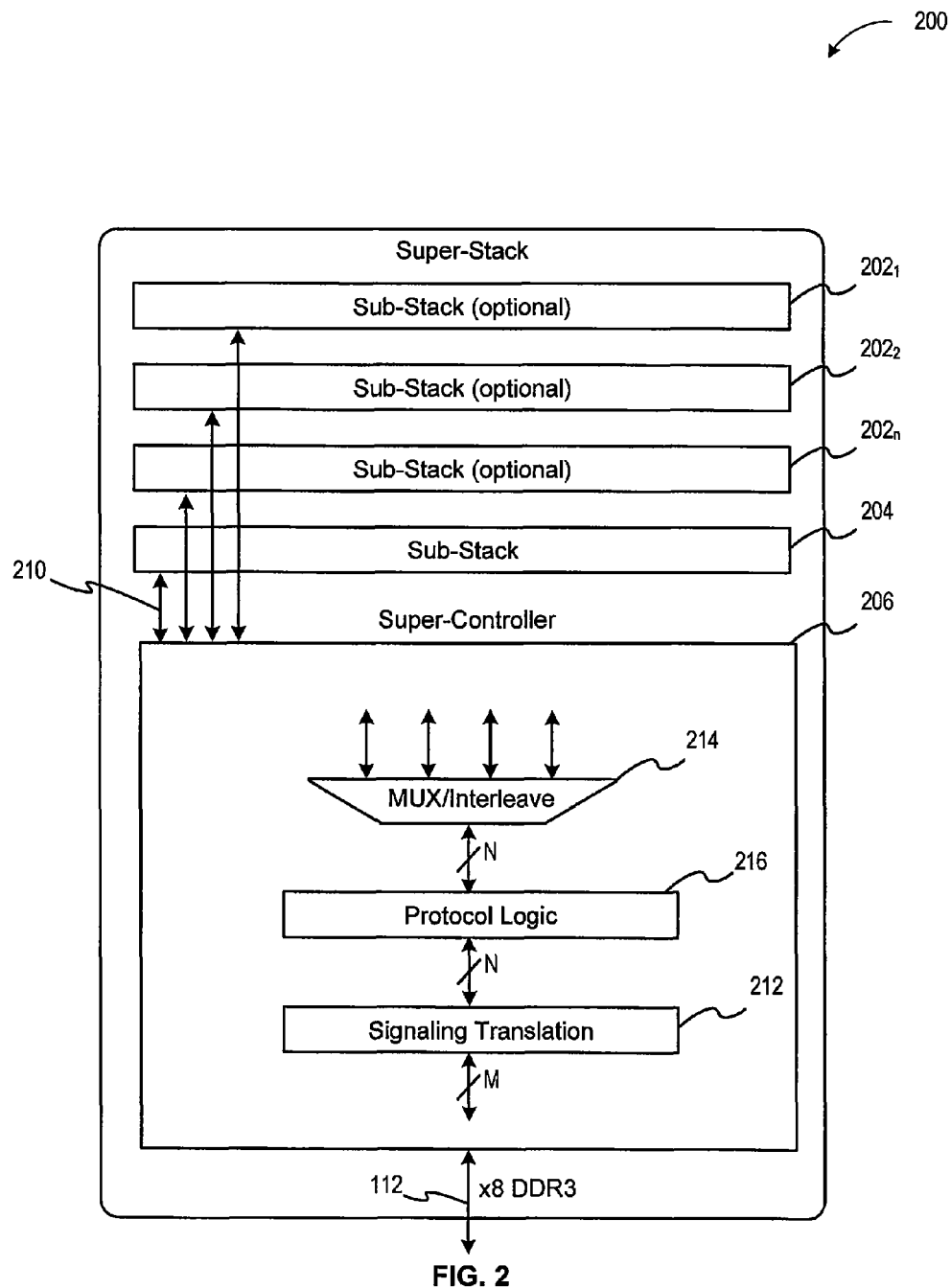
FIG. 2 shows a HybridDIMM Super-Stack with multiple Sub-stacks, according to one embodiment.
Figure 3:
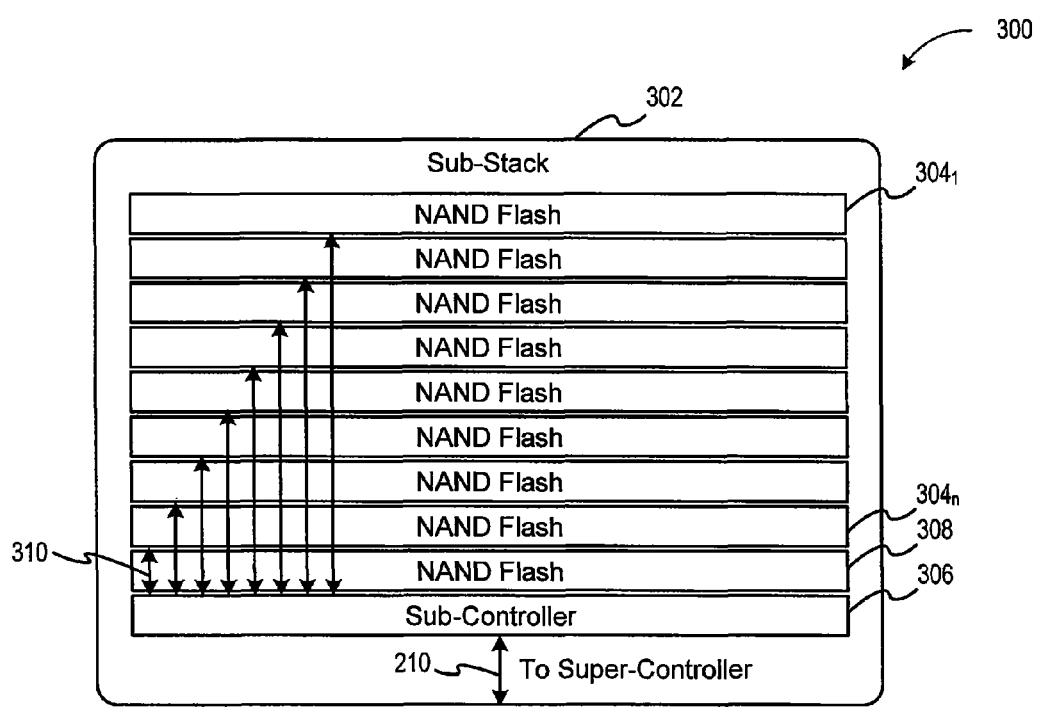
FIG. 3 shows a Sub-Stack showing a Sub-Controller, according to one embodiment.
Figure 4:
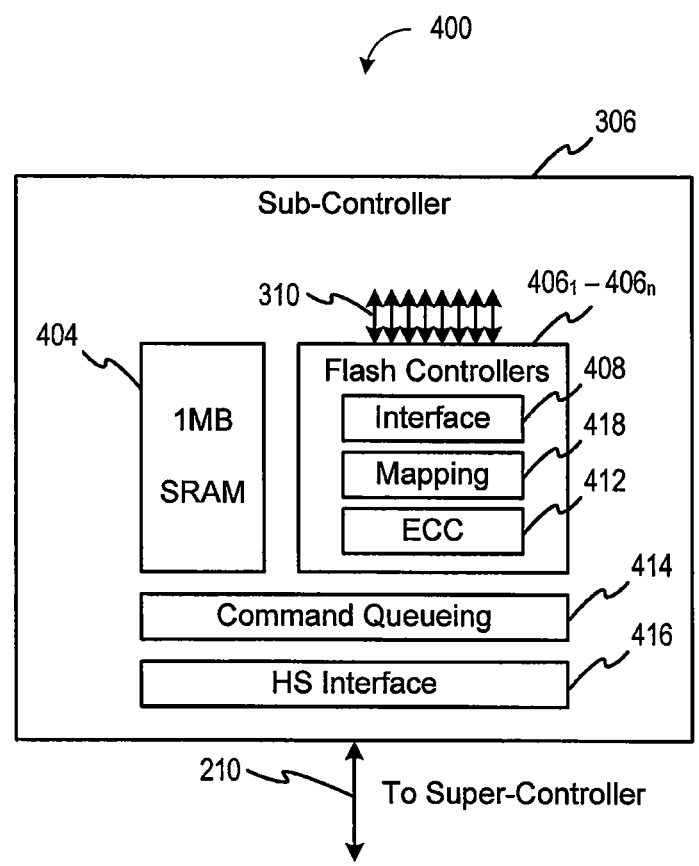
FIG. 4 shows the Sub-Controller, according to one embodiment.

FIGS. 2 through 4 illustrate various implementations of the Super-Stack 102, the Sub-Stack 122, and the Sub-Controller 126.

FIG. 2 shows a HybridDIMM Super-Stack 200 with multiple Sub-Stacks, according to one embodiment. The Hybrid-DIMM Super-Stack 200 shown in FIG. 2 comprises at least one Sub-Stack 204 including the slow memory and at least one Super-Controller 206. The HybridDIMM Super-Stack 200 shown in FIG. 2 may also comprise optional Sub-Stacks $202_1$-$202_n$ including the slow memory. Interfaces 210 between the Sub-Stack 204 (and/or the Sub-Stacks $202_1$-$202_n$) and the Super-Controller 206 may be an industry-standard flash-memory interface (e.g. NAND, NOR, etc.) and/or they may be a flash memory interface designed for flash-memory subsystems (e.g. OneNAND, ONFI, etc.). The embodiment shown includes the Super-Controller 206 that communicates over the interface 112 (as shown in FIG. 1B) to the memory controller of the host computer, using a standard memory interface (such as DDR3).

The Super-Controller 206 in FIG. 2 operates to provide error-detection and management of the interfaces 210 and 112, as well as management of the Sub-Stack 204, $202_1$-$202_n$ (also referred to herein as Sub-Stack components 204, $202_1$-$202_n$). The Super-Stack interface 112 appears as if Super-Stack 200 was a standard memory component. In a preferred embodiment, the interface 112 conforms to JEDEC x8 DDR3 standard, however in other embodiments, it could be x4 or x16 DDR3, or could be DDR, DDR2, GDDR, GDDR5 etc. In still other embodiments, the interface 112 could include a serial memory interface such as an FBDIMM interface.

The interfaces 210 in FIG. 2, between the Super-Controller 206 and one or more Sub-Stacks 204, $202_1$-$202_n$, may be variously configured. Note first that in other embodiments the Super-Controller 206 may optionally connect directly to one or more flash memory components 124 illustrated in FIG. 1B (not shown in FIG. 2). In some embodiments that use an optional direct interface to the flash memory components 124, the protocol of interface 210 is one of several standard flash protocols (NAND, NOR, OneNAND, ONFI, etc). Additionally, and strictly as an option, in the case that the interface 210 communicates with Sub-Stacks 204, $202_1$-$202_n$, the interface protocol may still be a standard flash protocol, or any other protocol as may be convenient.

With an understanding of the interfaces 210 and 112 of the Super-Stack 200, it follows to disclose some of the various functions of the Super-Stack 200.

The first internal function of the Super-Controller 206 is performed by a signaling translation unit 212 that translates signals (data, clock, command, and control) from a standard (e.g. DDR3) high-speed parallel (or serial in the case of a protocol such as FB-DIMM) memory channel protocol to one or more typically lower speed and possibly different bus-width protocols. The signaling translation unit 212 may thus also convert between bus widths (FIG. 2 shows a conversion from an m-bit bus to an n-bit bus). The signaling translation unit 212 converts the command, address, control, clock, and data signals from a standard memory bus to corresponding signals on the sub-stack or flash interface(s). The Super-Controller 206 may provide some or all (or none) of the logical functions of a standard DRAM interface to the extent it is "pretending" to be a DRAM on the memory bus. Thus in preferred embodiments, the Super-Controller 206 performs all the required IO characteristics, voltage levels, training, initialization, mode register responses and so on—as described by JEDEC standards. So, for example if the memory interface at 112 is a standard x8 DDR3 SDRAM interface then the Super-Controller memory interface as defined by the signaling translation unit 212 behaves as described by the JEDEC DDR3 DRAM standard.

A second internal function of the Super-Controller 206 is performed by protocol logic 216 that converts from one protocol (such as DDR3, corresponding to a fast memory protocol) to another (such as ONFI, corresponding to a slow memory protocol).

A third internal function of the Super-Controller 206 is performed by MUX/Interleave logic 214 that provides a MUX/DEMUX and/or memory interleave from a single memory interface to one or more Sub-Stacks 204, $202_1$-$202_n$, or alternatively (not shown in FIG. 2) directly to one or more flash memory components 124. The MUX/Interleave logic 214 is necessary to match the speed of the slow memory 104 (flash) to the fast memory 106 (DRAM).

FIG. 3 shows a Sub-Stack 302 including a Sub-Controller 306, according to one embodiment. As shown in FIG. 3, the Sub-Stack 302 includes the Sub-Controller 306 and a collection of NAND flash memory components 308, $304_1$-$304_n$. The interface 210 between the Sub-Stack 302 and the Super-Controller, such as the Super-Controller 206 or 116, has already been described in the context of FIG. 2. Interfaces 310 between the Sub-Controller 306 and the flash memory components 308, $304_1$-$304_n$ are standard flash interfaces. The interfaces 310 are defined by the flash memory components 308, $304_1$-$304_n$ that are used to build the Sub-Stack 302.

The flash memory components $308, 304_1$-$304_n$ are organized into an array or stacked vertically in a package using wire-bonded connections (alternatively through-silicon vias or some other connection technique or technology may be used). The Sub-Stack 302 shown as an example in FIG. 3 has 8 active flash memory components $304_1$-$304_n$ plus a spare flash memory component 308, resulting in an array or stack of 9 flash memory components $308, 304_1$-$304_n$. The spare flash memory component 308 is included to increase the yield of the Sub-Stack 302 during assembly. The capacity of the flash memory in the Sub-Stack 302 in aggregate (exclusive of any spare capacity) is any arbitrary size (e.g. 8 gigabit, 16 gigabit, 32 gigabit, etc), and prophetic configurations are envisioned to be arbitrarily larger, bounded only by the practical limits of the availability of the flash memory components $308, 304_1$-$304_n$. Thus, for example, the total flash capacity on a Hybrid-DIMM with 9 Super-Stacks (eight data and one for ECC) with four Sub-Stacks each containing eight 8-gigabit flash chips would be 32 gigabytes. Of course any known or derivative technology for flash may be used, including SLC, MLC, etc.

FIG. 4 shows the Sub-Controller 306, according to one embodiment. The Sub-Controller 306 contains (physically or virtually) as many flash controllers $406_1$-$406_n$ as there are flash memory components $308, 304_1$-$304_n$ in the Sub-Stack 302, the fast memory 404, plus (optionally) additional components to provide interfacing features and advanced functions. The optional components include Command Queuing logic 414 and High-Speed Interface logic 416. The interface 210 shown in FIG. 4 between the Sub-Controller and Super-Controller has already been described in the context of both FIG. 2 and FIG. 3. The interface 310 between the flash controllers and the flash chips was described in the context of FIG. 3.

It should be noted that each flash controller 406 in FIG. 4 may be a single block implementing one or more flash controllers, or it may be a collection of flash controllers, one each dedicated to controlling a corresponding flash memory device.

The High-Speed Interface logic 416 is configured to convert from a high-speed interface capable of handling the aggregate traffic from all of the flash memory components $308, 304_1$-$304_n$ in the Sub-Stack 302 to a lower speed interface used by the flash controllers and each individual flash memory component $308, 304_1$-$304_n$.

The Command Queuing logic 414 is configured to queue, order, interleave and MUX the data from both the fast memory 404 and array of slow flash memory components $308, 304_1$-$304_n$.

Each flash controller 406 contains an Interface unit 408, a Mapping unit 418, as well as ECC (or error correction) unit 412. The Interface unit 408 handles the I/O to the flash components in the Sub-Stack 302, using the correct command, control and data signals with the correct voltage and protocol. The ECC unit 412 corrects for errors that may occur in the flash memory in addition to other well-known housekeeping functions typically associated with flash memory (such as bad-block management, wear leveling, and so on). It should be noted that one or more of these housekeeping functions associated with the use of various kinds of slow memory such as flash may be performed on the host computer instead of being integrated in the flash controller. The functionality of the Mapping unit 418 will be described in much more detail shortly and is the key to being able to access, address and handle the slow flash memory and help make it appear to the outside world as fast memory operating on a fast memory bus.

Figure 5:
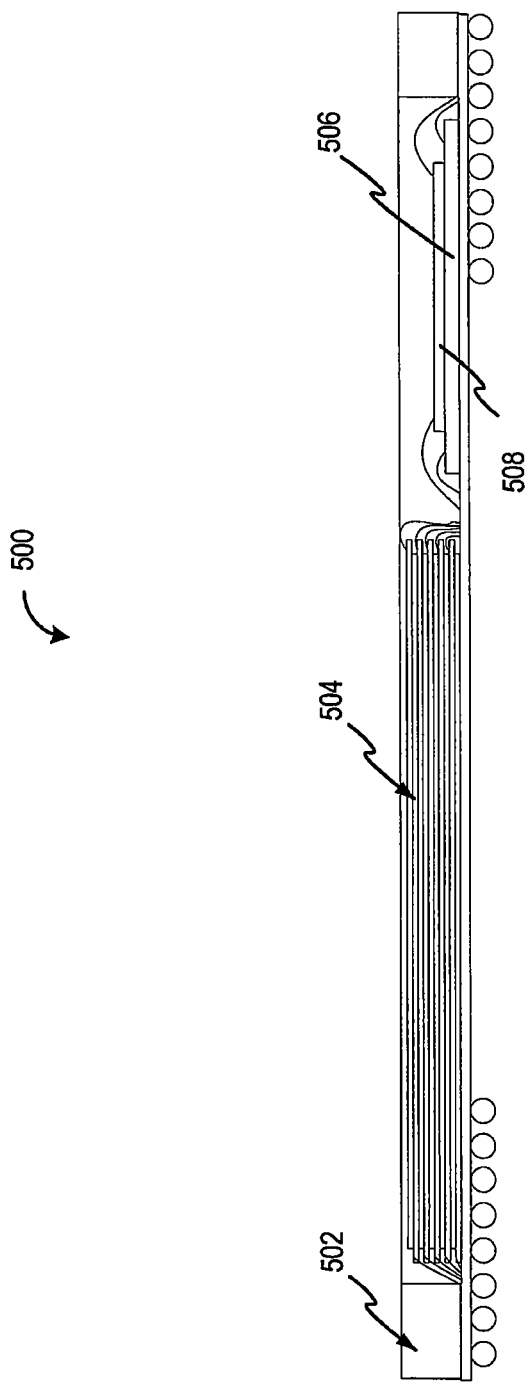
FIG. 5 depicts a physical implementation of a 1-high Super Stack, according to one embodiment.

FIG. 5 depicts a cross-sectional view of one possible physical implementation of a 1-high Super-Stack 502, according to one embodiment. In this embodiment, the Super-Stack 502 is organized as two vertical stacks of chips. A first vertical stack comprising a Super-Controller 506 and a Sub-Controller 508 situated on one end of a multi-chip package (MCP) substrate, and a second vertical Sub-Stack 504 comprises a plurality of flash memory components. The stacks in FIG. 5 show connections between flash memory components made using wire bonds. This is a typical and well-known assembly technique for stacked chips. Other techniques such as through-silicon vias or other chip-stacking techniques may be used. In addition there is no requirement to stack the Super-Controller 506 and Sub-Controller 508 separately from the flash memory components.

Figure 6:
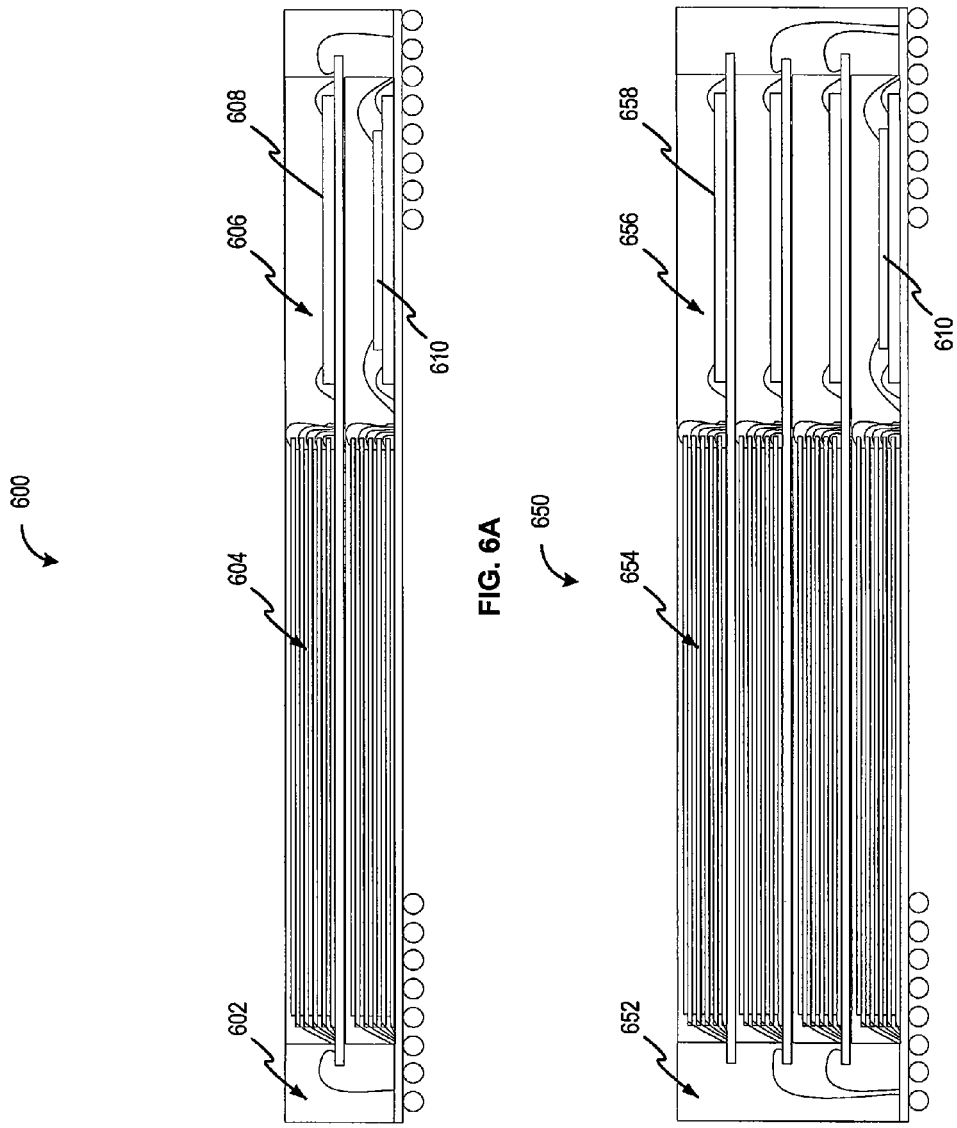
FIG. 6A depicts a physical implementation of 2-high Super-Stacks, according to one embodiment.
FIG. 6B depicts a physical implementation of a 4-high Super-Stack, according to one embodiment.

FIG. 6A depicts a physical implementation of 2-high Super-Stack 602, according to one embodiment. This implementation is called "2-high" because it essentially takes the 1-high Super-Stack shown in FIG. 5 and duplicates it. In FIG. 6A, element 604 comprise the flash chips, element 608 is a Sub-Controller, and element 610 is a Super-Controller.

FIG. 6B depicts a physical implementation of 4-high Super-Stack 652, according to one embodiment. In FIG. 6B, element 654 comprise the flash chips, element 658 is a Sub-Controller, and element 610 is a Super-Controller.

Having described the high-level view and functions of the HybridDIMM 100 as well as the details of one particular example implementation we can return to FIG. 1A in order to explain the operation of the HybridDIMM 100. One skilled in the art will recognize that the slow memory 104 (discussed above in embodiments using non-volatile memory) can be implemented using any type of memory—including SRAM or DRAM or any other type of volatile or nonvolatile memory. In such as case the fast memory 106 acting as a latency-hiding buffer may emulate a DRAM, in particular a DDR3 SDRAM, and thus present over the host interface 110 according to any one (or more) standards, such as a JEDEC-compliant (or JEDEC-compatible) DDR3 SDRAM interface.

Now that the concept of emulation as implemented in embodiments of a HybridDIMM has been disclosed, we may now turn to a collection of constituent features, including advanced paging and advanced caching techniques. These techniques are the key to allowing the HybridDIMM 100 to appear to be a standard DIMM or to emulate a standard DIMM. These techniques use the existing memory management software and hardware of the host computer to enable two important things: first, to allow the computer to address a very large HybridDIMM 100, and, second, to allow the computer to read and write to the slow memory 104 indirectly as if the access were to the fast memory 106. Although the use and programming of the host computer memory management system described here employs one particular technique, the method is general in that any programming and use of the host computer that results in the same behavior is possible. Indeed because the programming of a host computer system is very flexible, one of the most powerful elements of the ideas described here is that it affords a wide range of implementations in both hardware and software. Such flexibility is both useful in itself and allows implementation on a wide range of hardware (different CPUs for example) and a wide range of operating systems (Microsoft Windows, Linux, Solaris, etc.).

In particular, embodiments of this invention include a host-based paging system whereby a paging system allows access to the mixed-technology memory module 100, a paging system is modified to allow access to the mixed-technology memory module 100 with different latencies, and modifications to a paging system that permits access to a larger memory space than the paging system would normally allow.

Again considering the fast memory 106, embodiments of this invention include a caching system whereby the Hybrid DIMM 100 alters the caching and memory access process.

For example, in one embodiment of the HybridDIMM 100 the well-known Translation Lookaside Buffer (TLB) and/or Page Table functions can be modified to accommodate a mixed-technology DIMM. In this case an Operating System (OS) of the host computer treats main memory on a module as if it were comprised of two types of memory or two classes of memory (and in general more than one type or class of memory). In our HybridDIMM implementation example, the first memory type corresponds to fast memory or standard DRAM and the second memory type corresponds to slow memory or flash. By including references in the TLB (the references may be variables, pointers or other forms of table entries) to both types of memory different methods (or routines) may be taken according to the reference type. If the TLB reference type shows that the memory access is to fast memory, this indicates that the required data is held in the fast memory (SRAM, DRAM, embedded DRAM, etc.) of the HybridDIMM (the fast memory appears to the host as if it were DRAM). In this case a read command is immediately sent to the HybridDIMM and the data is read from SRAM (as if it were normal DRAM). If the TLB shows that the memory access is to slow memory, this indicates that the required data is held in the slow memory (flash etc.) of the HybridDIMM. In this case a copy command is immediately sent to the HybridDIMM and the data is copied from flash (slow memory) to SRAM (fast memory). The translation between host address and HybridDIMM address is performed by the combination of the normal operation of the host memory management and the mapper logic function on the HybridDIMM using well-known and existing techniques. The host then waits for the copy to complete and issues a read command to the HybridDIMM and the copied data is read from SRAM (again now as if it were normal DRAM).

Having explained the general approach, various embodiments of such techniques, methods (or routines) are presented in further detail below. In order to offer consistency in usage of terms, definitions are provided here, as follows:
va—virtual address that caused the page fault
sp—SRAM page selected in Step 1
pa—a physical address
Page Table and Mapper requirements:
PageTable[va]==pa
Mapper[pa]==sp
Hence: Mapper[PageTable[va]]=sp
How do we select a physical address "pa"?
Must not already map to an active SRAM location
Must map to the BigDIMM that contains the "sp"
The caches must not contain stale data with "pa" physical tags
No processor in the coherence domain must contain a stale TLB entry for "va"

Figure 7:
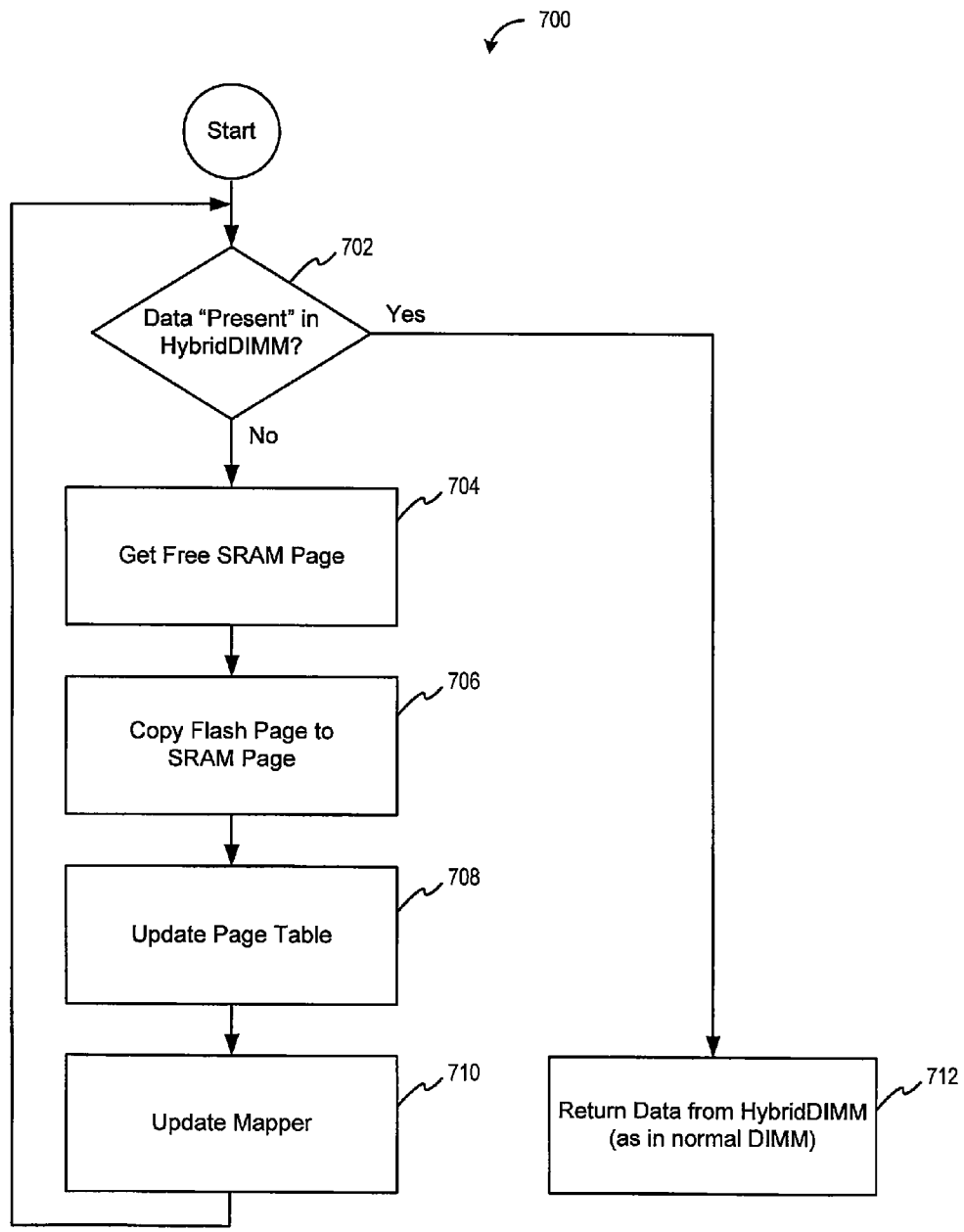
FIG. 7 shows a method of retrieving data from a HybridDIMM, according to one embodiment.
Figure 8A:
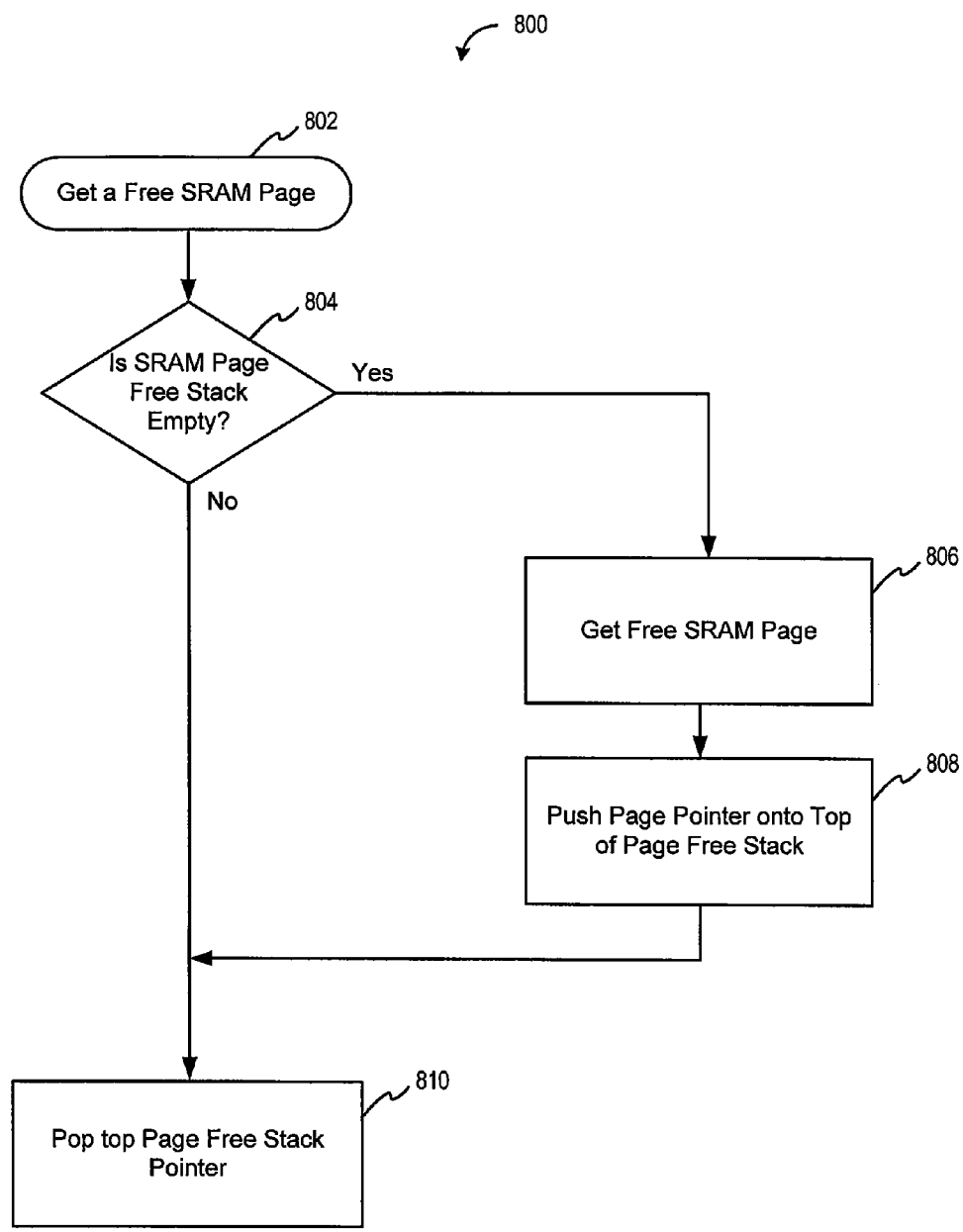
FIG. 8A shows a method of managing SRAM pages on a HybridDIMM, according to one embodiment.
Figure 8B:
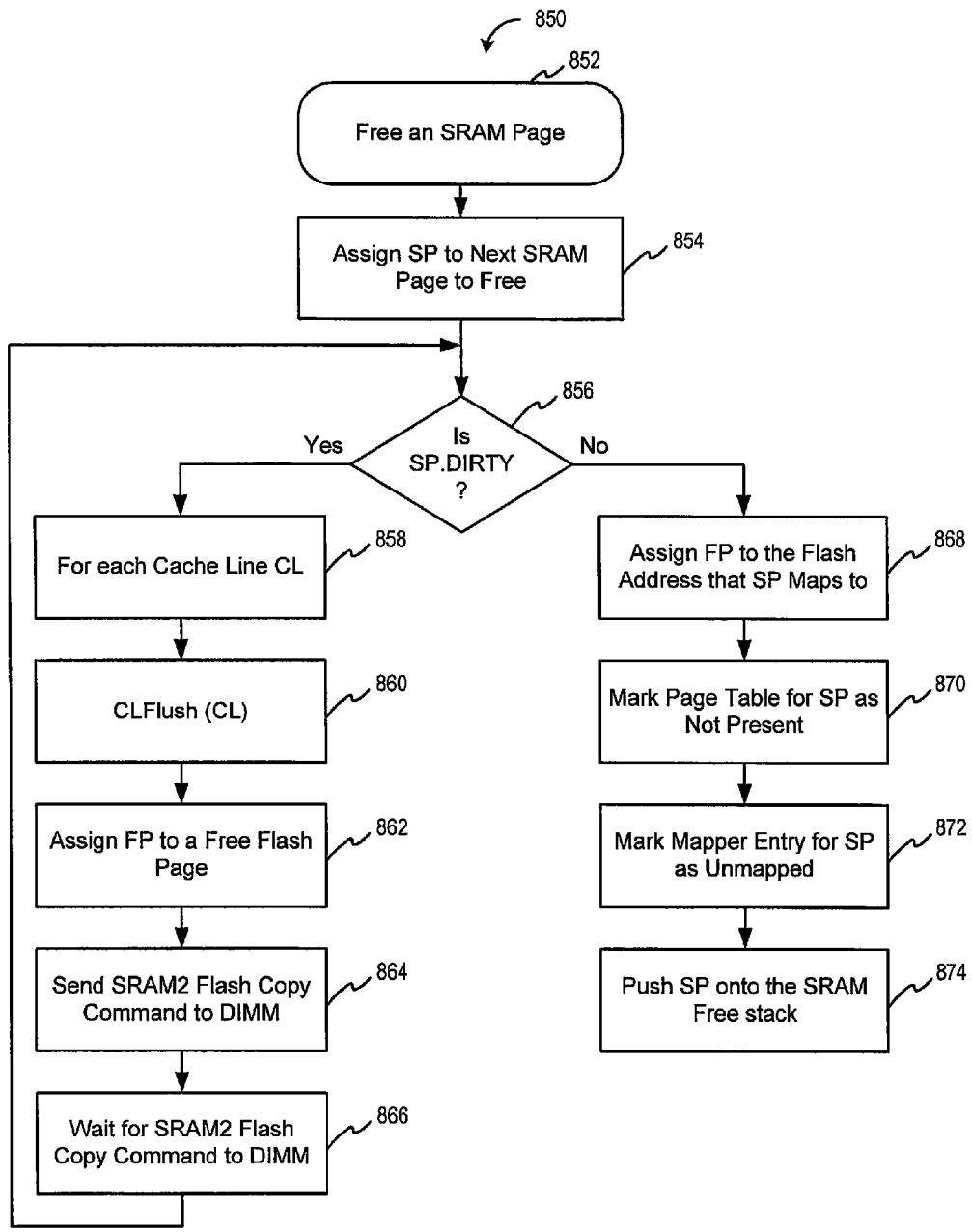
FIG. 8B shows a method of freeing SRAM pages on a HybridDIMM, according to one embodiment.
Figure 9:
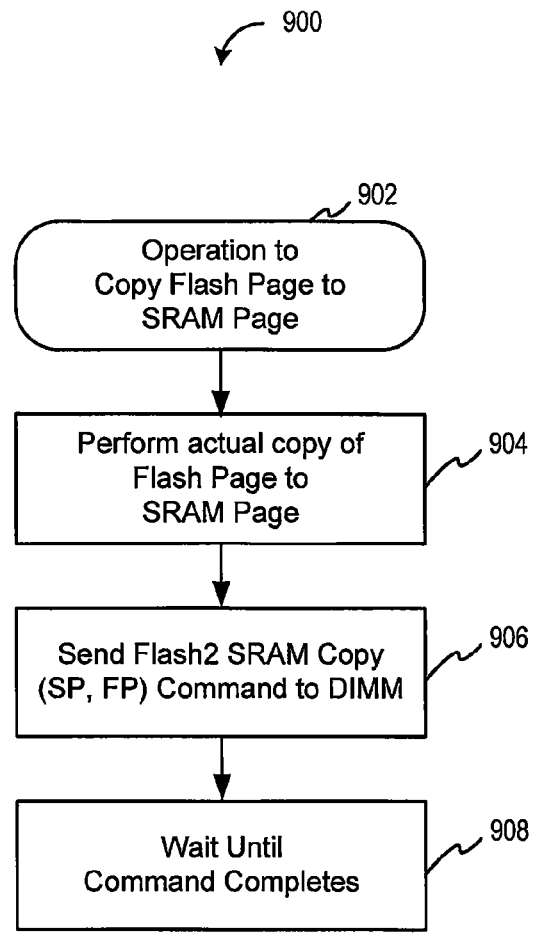
FIG. 9 shows a method of copying a flash page to an SRAM page on a HybridDIMM, according to one embodiment.

FIGS. 7 through 9 illustrate interactions between the OS of the host computer and the mixed-technology memory module 100 from the perspective of the OS. Although the method steps of FIGS. 7-9 are described with respect to the memory management portion of the computer OS, any elements or combination of elements within the OS and/or computer configured to perform the method steps, in any order, falls within the scope of the present invention.

FIG. 7 shows a method 700 for returning data resident on the HybridDIMM to the memory controller. As an option, the present method 700 may be implemented in the context of the architecture and functionality of FIG. 1 through FIG. 6. Of course, however, the method 700 or any operation therein may be carried out in any desired environment.

The method 700 as described herein may be entered as a result of a request from the memory controller for some data resident on a HybridDIMM. The operation underlying decision 702 may find the data is "Present" on the HybridDIMM (it is standard and well-known that an OS uses the terms "Present" and "Not Present" in its page tables). The term "Present" means that the data is being held in the fast memory on a HybridDIMM. To the OS it is as if the data is being held in standard DRAM memory, though the actual fast memory on the HybridDIMM may be SRAM, DRAM, embedded DRAM, etc. as we have already described. In the example here we shall use fast memory and SRAM interchangeably and we shall use slow memory and flash memory interchangeably. If the data is present then the BigDIMM returns the requested data as in a normal read operation (operation 712) to satisfy the request from the memory controller. Alternatively, if the requested data is "Not Present" in fast memory, the OS must then retrieve the data from slow memory. Of course retrieval from slow memory may include various housekeeping and management (as already has been described for flash memory, for example). More specifically, in the case that the requested data is not present in fast memory, the OS allocates a free page of fast memory (operation 704) to serve as a repository, and possibly a latency-hiding buffer for the page containing the requested data. Once the OS allocates a page of fast memory, the OS then copies at least one page of memory from slow memory to fast memory (operation 706). The OS records the success of the operation 706 in the page table (see operation 708). The OS then records the range of addresses now present in fast memory in the mapper (see operation 710). Now that the initially requested data is present in fast memory, the OS restarts the initially memory access operation from the point of decision 702.

To make the operations required even more clear the following pseudo-code describes the steps to be taken in an alternative but equivalent fashion:
A. If Data is "Present" (e.g. present in memory type DRAM) in the HybridDIMM:
    The HybridDIMM SRAM behaves the same as standard DRAM
B. Data "Not Present" (e.g. present in memory type Flash)—there is a HybridDIMM Page Fault:
    1. Get free SRAM page
    2. Copy flash page to SRAM page
    3. Update Page Table and/or TLB
    4. Update Mapper
    5. Restart Read/Write (Load/Store)

We will describe the steps taken in method or code branch B above in more detail presently. First, we must describe the solution to a problem that arises in addressing or accessing the large HybridDIMM. In order to access the large memory space that is made possible by using a HybridDIMM (which may be as much as several terabytes), the host OS may also modify the use of well-known page-table structures. Thus for example, a 256 terabyte virtual address space (a typical limit for current CPUs because of address-length limitations) may be mapped to pages of a HybridDIMM using the combination of an OS page table and a mapper on the HybridDIMM. The OS page table may map the HybridDIMM pages in groups of 8. Thus entries in the OS page table correspond to HybrdDIMM pages (or frames) 0-7, 8-15, 16-23 etc. Each entry in the OS page table points to a 32 kilobyte page (or frame), that is either in SRAM or in flash on the HybridDIMM. The mapping to the HybridDIMM space is then performed through a 32 GB aperture (a typical limit for current memory controllers that may only address 32 GB per DIMM). In this case a 128-megabyte SRAM on the HybridDIMM contains 4096 pages that are each 32 kilobyte in size. A 2-terabyte flash memory (using 8-, 16-, or 32-gigabit flash memory chips) on the HybridDIMM also contains pages that are 32 kilobyte (made up from 8 flash chips with 4 kilobyte per flash chip).

The technique of using an aperture, mapper, and table in combination is well-known and similar to, for example, Accelerated Graphics Port (AGP) graphics applications using an AGP Aperture and a Graphics Address Relocation Table (GART).

Now the first four steps of method or code branch B above will be described in more detail, first using pseudo-code and then using a flow diagram and accompanying descriptions:

---
Step 1 - Get a free SRAM page
---

```
Get free SRAM page( )
    if SRAM page free list is empty( ) then
        Free an SRAM page;
    Pop top element from SRAM page free list
Free an SRAM page:
    sp = next SRAM page to free; // depending on chosen replacement
policy
    if sp is dirty then
        foreach cache line CL in sp do // ensure SRAM contains last
written data;
                                        // could instead also set caches to
write-through
            CLFlush(CL);        // <10µps per 32KB
        fp = Get free flash page; // wear leveling, etc. is perfomed here
        Send SRAM2flashCpy(sp, fp) command to DIMM;
        Wait until copy completes;
    else
        fp = flash address that sp maps to;
    Page Table[virtual address(sp)] = "not present", fp;
// In MP environment must handle multiple TLBs using additional
code here
    Mapper[sp] = "unmapped"
    Push sp on SRAM page free list
```

Step 2—Copy flash page to SRAM Copy flash page to SRAM page:
  Send flash2SRAMCpy(sp, fp) command to DIMM;
  Wait until copy completes;
  Step 3—Update Page Table
Update Page Table:
// Use a bit-vector and rotate through the vector—cycling from 0 GB up to the 32 GB aperture and then roll around to 0GB, re-using physical addresses
  pa=next unused physical page;
  if (pa==0) then
    WBINVD; // we have rolled around so flush and invalidate the entire cache
  PageTable[va]=pa;

Now we shall describe the key elements of these steps in the pseudo-code above using flow diagrams and accompanying descriptions. FIG. 8A shows a method 800 for the OS to obtain a free page of fast memory ("Get free SRAM page" in the above pseudo-code). Remember we are using fast memory and SRAM interchangeably for this particular example implementation. As an option, the present method 800 may be implemented in the context of the architecture and functionality of FIG. 1 through FIG. 7. Of course, however, the method 800 or any operation therein may be carried out in any desired environment.

The operation 704 from FIG. 7 indicates an operation for the OS to get a page of fast memory. Although many embodiments are possible and conceived, one such operation is disclosed here, namely the method 800. That is, the method 800 is entered at entry point 802 whenever a new page of fast memory is needed. The decision 804 checks for a ready and available page from the page free stack. If there is such an available page, the OS pops that page from the page free stack and returns it in operation 810. Alternatively, if the free stack is empty then the decision 804 will proceed to operation 806. Operation 806 serves to acquire a free fast memory page, whether acquired from a pool or reused resources or whether from a newly allocated page. Once acquired then, the OS pushes the pointer to that page onto the page free stack and the processing proceeds to operation 810, returning the free fast memory page as is the intended result to the method 800.

FIG. 8B shows a method 850 for the OS to free a page of fast memory ("Free an SRAM page" in the above pseudo-code). As an option, the present method 850 may be implemented in the context of the architecture and functionality of FIG. 1 through FIG. 8A. Of course, however, the method 850 or any operation therein may be carried out in any desired environment.

The operation 806 from FIG. 8A indicates an operation for the OS to free a page of fast memory. Although many embodiments are possible and conceived, one embodiment of such an operation is disclosed here, namely the method 850. That is, the method 850 is operable to free a page of fast memory, while maintaining the fidelity of any data that may had previously been written to the page.

As shown, the system is entered when a page of fast memory is required. In general, a free fast memory page could be a page that had previously been allocated, used and subsequently freed, or may be a page that has been allocated and is in use at the moment that the method 850 is executed. The decision 856 operates on a pointer pointing to the next fast memory page to free (from operation 854) to determine if the page is immediately ready to be freed (and re-used) or if the page is in use and contains data that must be retained in slow memory (a "dirty" page). In the latter case, a sequence of operations may be performed in the order shown such that data integrity is maintained. That is, for each cache line CL (operation 858), the OS flushes the cache line (operation 860), the OS assigns a working pointer FP to point to a free slow memory page (see operation 862), the OS writes the 'Dirty' fast memory page to slow memory (operation 864), and the loop continues once the operation 864 completes.

In the alternative (see decision 856), if the page is immediately ready to be freed (and re-used), then the OS assigns the working pointer FP to point to a slow memory address that SP maps to (operation 868). Of course since the corresponding page will now be reused for cache storage of new data, the page table must be updated accordingly to reflect that the previously cached address range is (or will soon be) no longer available in cache (operation 870). Similarly, the OS records the status indicating that address range is (or will soon be) not mapped (see operation 872). Now, the page of fast memory is free, the data previously cached in that page (if any) has been written to slow memory, and the mapping status has been marked; thus the method 850 pushes the pointer to the page of fast memory onto the page free stack.

FIG. 9 shows a method 900 copying a page of slow memory to a page of fast memory. As an option, the present method 900 may be implemented in the context of the architecture and functionality of FIG. 1 through FIG. 8B. Of course, however, the method 900 or any operation therein may be carried out in any desired environment.

The operation 706 from FIG. 7 indicates an operation to copy page of slow memory to a page of fast memory. In the embodiment shown, the OS is operable to not only perform the actually copy, but also to perform bookkeeping and synchronization. In particular, after the actual copy is performed (operation 904) the OS sends the fact that this copy has been performed to the HybridDIMM (operation 906) and the method 900 waits (operation 908) until completion of operation 906 is signaled.

These methods and steps are described in detail only to illustrate one possible approach to constructing a host OS and memory subsystem that uses mixed-technology memory modules.

While the foregoing is directed to embodiments of the present invention, other and further embodiments of the present invention may be devised without departing from the basic scope thereof, and the scope thereof is determined by the claims that follow.

We claim:

1. A memory module, comprising:
   a plurality of sub-stacks including memory devices of a first type, each sub-stack comprising:
      a respective plurality of memory devices of the first type; and
      a respective sub-controller configured to control the respective plurality of memory devices of the first type;
   a super-controller configured to control each of the sub-controllers of the plurality of sub-stacks; and
   a host interface coupled to the super-controller and configured to transmit data to a memory controller.

2. The memory module of claim 1, further comprising a super-stack interface configured to transmit data between the super-controller and the host interface.

3. The memory module of claim 1, wherein each sub-stack further includes a respective interface configured to communicate data between the sub-controller and the super-controller.

4. The memory module of claim 3, wherein each sub-controller further comprises command queuing logic configured to:
   receive first data from the plurality of memory devices;
   multiplex the first data to produce multiplexed data; and
   transmit the multiplexed data to the super-controller via the interface.

5. The memory module of claim 3, wherein each sub-controller further comprises high-speed interface logic configured to convert data of a first signaling speed to data of a second signaling speed.

6. The memory module of claim 1, wherein the super-controller includes protocol logic configured to convert a first protocol to a second, different protocol.

7. The memory module of claim 1,
   wherein the super-controller is configured to:
      communicate with a memory controller using a first memory channel protocol having a first signaling speed; and
      communicate with the sub-controllers using a second memory channel protocol having a second signaling speed, the second signaling speed being different from the first signaling speed,
   wherein the super-controller further comprises a signaling translation unit configured to translate data, clock, command, and control signals from the first memory channel protocol having the first signaling speed to the second memory channel protocol having the second signaling speed.

8. The memory module of claim 1, wherein the super-controller further comprises interleave logic configured to multiplex or demultiplex data between the sub-stacks and the host interface.

9. The memory module of claim 1, wherein each sub-controller further comprises:
   a respective fast memory device;
   a respective flash controller configured to provide interface, mapping, error detection, or error correction functionality to the respective plurality of memory devices; and
   a respective flash interface configured to transmit data between the flash controller and the plurality of memory devices.

10. The memory module of claim 9, wherein the fast memory device comprises a volatile memory device, and wherein the plurality of memory devices comprise non-volatile memory devices.

11. The memory module of claim 9, wherein the fast memory device comprises a volatile memory device of a first signaling speed, and wherein the plurality of memory devices comprise volatile memory devices of a second, different signaling speed.

12. The memory module of claim 9, wherein the fast memory device is configured to hold data stored at one or more of the respective plurality of memory devices.

13. The memory module of claim 1, wherein the respective plurality of memory devices of a particular sub-stack are vertically stacked using through-silicon vias.

14. The memory module of claim 1, wherein the respective plurality of memory devices of a particular sub-stack are vertically stacked using wire-bonded connections.

15. The memory module of claim 1, wherein the plurality of sub-stacks are stacked vertically to form a super stack.

16. The memory module of claim 15, wherein the plurality of sub-stacks are stacked vertically on the super-stack controller.

17. A memory module, comprising:
   a first sub-stack comprising:
      first memory devices of a particular type; and
      a first sub-controller configured to control the first memory devices of the particular type;
   a second sub-stack comprising:
      second memory devices of the particular type; and
      a second sub-controller configured to control the second memory devices of the particular type;
   a super-controller configured to control the first sub-controller of the first sub-stack and the second sub-controller of the second sub-stack; and
   a host interface coupled to the super-controller and configured to transmit data to a memory controller.

18. The memory module of claim 17, wherein the first sub-controller is stacked on a first area of the super-controller, and wherein the second sub-controller is stacked on a second area of the super-controller.

19. The memory module of claim 18, wherein the first sub-stack is stacked on the super-controller, and the second sub-stack is stacked on the first sub-stack.

20. An apparatus, comprising:
   a multi-chip package (MCP) substrate;
   a memory controller situated on a first area of the MCP substrate;
   a plurality of sub-stacks including memory devices of a first type, each sub-stack comprising:
      a respective plurality of memory devices of the first type; and
      a respective sub-controller configured to control the respective plurality of memory devices of the first type;

a super-controller situated on a second area of the MCP substrate and configured to control each of the sub-controllers of the plurality of sub-stacks; and a host interface coupled to the super-controller and configured to transmit data to the memory controller.

* * * * *